(12) United States Patent
Onakado et al.

(10) Patent No.: US 6,469,339 B1
(45) Date of Patent: Oct. 22, 2002

(54) SEMICONDUCTOR MEMORY WITH VOIDS FOR SUPPRESSING CRYSTAL DEFECTS

(75) Inventors: Takahiro Onakado, Hyogo (JP); Satoshi Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/773,624

(22) Filed: Feb. 2, 2001

(30) Foreign Application Priority Data

Aug. 23, 2000 (JP) ........................................ 2000-252158

(51) Int. Cl.[7] ............................................ H01L 29/788
(52) U.S. Cl. ........................ 257/315; 438/201; 438/216; 438/257
(58) Field of Search .......................... 257/315; 438/201, 438/211, 257

(56) References Cited

U.S. PATENT DOCUMENTS 5,814,888 A * 9/1998 Nishioka et al. ............ 257/758
6,303,464 B1 * 10/2001 Gaw et al. ................... 438/422

FOREIGN PATENT DOCUMENTS

| JP | 8-97379 | 4/1996 |
| JP | 10-229121 | 8/1998 |

* cited by examiner

Primary Examiner—Nathan J. Flynn
Assistant Examiner—Scott R. Wilson
(74) Attorney, Agent, or Firm—McDermott, Will & Emery

(57) ABSTRACT

A trench isolating oxide film is formed in a groove formed at a silicon substrate. Floating gate electrodes and control gate electrodes are formed on trench isolating oxide film. An opening exposing the surface of silicon substrate is formed in a region located between the floating gate electrodes and others. The control gate electrodes are covered with a BPTEOS film filling opening. A void is formed within opening filled with BPTEOS film. The void suppresses occurrence of crystal defects in the silicon substrate, and the semiconductor device ensuring high reliability and high yield is obtained.

9 Claims, 34 Drawing Sheets

SEMICONDUCTOR MEMORY WITH VOIDS FOR SUPPRESSING CRYSTAL DEFECTS

BACKGROUND OF THE INVENTION

1. Field of the Invention

The present invention relates to a semiconductor device, and particularly a semiconductor device which can suppress occurrence of crystal defects in a semiconductor substrate during and after manufacturing of the semiconductor device.

2. Description of the Background Art

In recent years, a flash memory which is a kind of nonvolatile semiconductor memory device has been expected as a useful memory device for the next generation because it can be manufactured at a lower cost than a Dynamic Random Access Memory (DRAM). A memory cell of a flash memory includes a source region connected to a corresponding source line, a drain region connected to a corresponding bit line, a floating gate electrode for storing information and a control gate electrode connected to a corresponding word line.

An FN (Fowler Nordheim) current phenomenon, a channel hot electron phenomenon or the like is caused in a gate insulating film formed of a tunnel oxide film, which is located immediately under the floating gate electrode, for injecting electrons into the floating gate electrode or removing electrons accumulated in the floating gate electrode so that erasing or writing of information is performed. As a result of the foregoing injection and removal of electrons with respect to the floating gate electrode, a binary state of the threshold is determined according to the state of electrons in the floating gate electrode, and "0" or "1" is read out depending on this binary state.

A memory cell array structure of an NOR (Not OR) type is used most generally in a nonvolatile semiconductor memory of a floating gate type such as a flash memory of the foregoing structure and other EEPROMs (Electrically Erasable and Programmable Read Only Memories) including floating gate electrodes.

The NOR type array is provided with contacts, which are connected to drain regions of memory cells in respective rows. Bit lines are formed in the row direction. Each bit line is formed of, e.g., an interconnection of a policide structure of metal silicide and polycrystalline silicon or a metal interconnection. Gate interconnections of memory cells in respective columns are formed in the column direction. The bit lines and columns lines are arranged in a matrix form.

An example of a planar structure of conventional flash memories is shown in FIG. 43. As shown in FIG. 43, control gate electrodes 112a, 112b, 112c and 112d which are spaced from each other extend across a plurality of element formation regions S, which are isolated from each other by trench isolating oxide films 103. Floating gate electrodes 110a, 110b, 110c and 110d, which are located immediately under control gate electrodes 112a, 112b, 112c and 112d, are formed in portions where these control gate electrodes cross element formation regions S, respectively.

A source regions 106a is formed, e.g., in one of element formation regions S located on the opposite sides of control gate electrode 112b, and a drain region 104b is formed in the other element formation region S. Each drain region is electrically connected to the bit line (not shown) via a contact hole 117.

The source regions are electrically connected together by an impurity region of a predetermined conductivity type, which is formed in a silicon substrate portion located immediately under a region between control gate electrodes 112a and 112b. The above source region structure in the memory cells is particularly referred to as a self-align source structure. In the self-align source structure, the source regions of the respective memory cells are not connected by an interconnection via a contact, but are connected by a diffusion layer interconnection. In other words, the diffusion layer interconnection includes the source regions.

A method of manufacturing a self-align source structure will now be described. A photoresist pattern (not shown) is formed over an entire area except for the region defined between control gate electrodes 112a and 112b shown in FIG. 43 and others, where the source regions are to be formed, respectively.

Using the photoresist pattern and control gate electrodes 112a and 112b as a mask, etching is effected to remove trench isolating oxide films 103 located in the region between control gate electrodes 112a and 112b so that the surfaces of silicon substrate located immediately under trench isolating oxide films 103 are exposed.

Then, ions of a predetermined conductivity type are implanted into the exposed surfaces of silicon substrate located between control gate electrodes 112a and 112b so that the respective source regions are formed, and the diffusion layer interconnection connecting the respective source regions in the column direction is formed in a self-aligned fashion.

Thereby, a sectional structure shown in FIG. 44 is formed. In FIG. 44, which is a cross section taken along section line XLIV—XLIV in FIG. 43, a diffusion layer interconnection 106 including the source regions is formed in a self-aligned fashion at the surface of silicon substrate 102, which includes the surfaces of grooves 102a, and is exposed by removal of trench isolating oxide films 103. This diffusion layer interconnection 106 forms the source region in a portion (i.e., a region between grooves 102a) of the main surface of silicon substrate 102.

In a sectional structure shown in FIG. 45, which is a cross section taken along line XLV—XLV in FIG. 45, trench isolating oxide films 103 are removed from the region between control gate electrodes 112a and 112b as well as the region between control gate electrodes 112c and 112d so that openings 103 exposing the surface of silicon substrate 102 (bottoms of grooves 102a) are formed. Diffusion layer interconnections 106 including source regions are formed at the exposed surface portions of silicon substrate 102.

Thereafter, sidewall insulating films 114a are formed on side surfaces of control gate electrodes 112a–112d including the side surfaces of openings 103a, as shown in FIGS. 44 and 45. Then, a TEOS (Tetra Ethyl Ortho Silicate glass) film 115 covering control gate electrodes 112a–112d is formed.

Then, as shown in FIGS. 46 and 47, a BPTEOS (Boro Phospho Tetra Ethyl Ortho Silicate glass) film 116 which will form an interlayer insulating film is then formed on TEOS film 115. Then, as shown in FIGS. 48 and 49, thermal processing or polishing is effected to smoothen the surface of BPTEOS film 116. In these manners, a major portion of the flash memory of the NOR type array is completed.

According to this flash memory, the self-align source structure is employed in the source region of memory cell so that it is not necessary to make an electrical connection between the source regions via contacts. Thus, the source region of memory cell is formed in the region defined between the neighboring two control gate electrodes according to design rules, and therefore the memory cells can be miniaturized and/or can be arranged at high density.

According to the flash memory employing the self-align source structure, as described above, the source region is formed in the region defined between the neighboring two control gate electrodes according to the minimum design rule so that the memory cells can be miniaturized.

Further, the trench isolating structure which uses trench isolating oxide film 103 is used as the isolating structure for electrically isolating the elements, as described above. This trench isolation structure allows further miniaturization compared with a conventional LOCOS isolation structure. In the trench isolation structure, groove 102a having relatively steep side surfaces is formed in silicon substrate 102, and is filled with the oxide film to form trench isolating oxide film 103, as shown in FIG. 44.

However, when forming the source region of the self-aligned structure in the flash memory described above, trench isolating oxide film 103 filling groove 102a is removed from a portion or region between the neighboring two control gate electrodes so that opening 103a exposing the surface of silicon substrate (groove 102a) is formed.

As shown in FIG. 50 or 51, opening 103a has a substantial depth which is equal to a value obtained by adding a thickness(es) of control gate electrode 112a–112d and floating gate electrode 110a–110d to a depth of groove 102a, and opening 103a forms the deepest opening in the pattern formed on silicon substrate 2.

FIG. 51 is a cross section showing a sectional structure of a portion near the element formation region and taken along line LI—LI in FIG. 43. In FIG. 51, floating gate electrodes 110a–110d are formed under control gate electrodes 112a–112d with an ONO film 109 therebetween, respectively.

Since opening 103a is the deepest portion, a large stress acts on silicon substrate 102 located on the bottom of opening 103a surrounded by dotted line B after BPTEOS film 116 serving as the interlayer insulating film is formed within opening 103a. This stress may cause crystal defects in silicon substrate 102 during a later manufacturing step. Also, the stress may cause crystal defects in silicon substrate 102 of the completed semiconductor device.

In the memory cell region of the flash memory having the self-aligned structure, opening 103a formed in the region between the two neighboring control gate electrodes is filled with the interlayer insulating film such as BPTEOS film 116 as described above. This increases the stress particularly in a portion of silicon substrate 102 located on the bottom of opening 103a, and thereby increases the possibility of occurrence of crystal defects in silicon substrate 102.

The crystal defects in silicon substrate 102 may cause, e.g., a leak current, and thereby may impede intended operations of the flash memory. Further, the crystal defects may impede intended operations as the semiconductor device, resulting in reduction in yield of the semiconductor devices.

When the flash memories are miniaturized to a further extent from now on, the aspect ratio of this opening will further increase, and it can be estimated that the stress acting on the above portion of the silicon substrate will further increase. As a result, crystal defects will be more liable to occur in the silicon substrate, resulting in further reduction in reliability of the operation of the semiconductor device as well as reduction in yield.

SUMMARY OF THE INVENTION

The invention is intended to overcome the possible problems described above, and an object of the invention is to provide a semiconductor device, which can suppress occurrence of crystal defects in a semiconductor substrate, and thereby can ensure high reliability of operations and high yield.

According to a first aspect of the invention, a semiconductor device includes a semiconductor substrate having a main surface, a groove, a first insulating film, two conductive layers, an opening, a second insulating film and a void. The groove is formed at the main surface of the semiconductor substrate. The first insulating film fills the groove. The two conductive layers are formed on the first insulating film with a space between each other. The opening is formed in the first insulating film, and exposes the surface of the semiconductor substrate located immediately under the first insulating film located between two interconnections. The second insulating film fills the opening, and covers the two conductive layers. The void is formed in the opening filled with the second insulating film.

According to this structure, the void formed in the opening reduces a stress, which acts on the semiconductor substrate particularly in a bottom portion of the opening, in manufacturing steps of the semiconductor device after formation of the second insulating film. In addition to the stages during manufacturing, the void also reduces the stress acting on the semiconductor substrate of the completed semiconductor device. The reduction in stress suppresses occurrence of crystal defects in the semiconductor substrate, and therefore can prevent disadvantages such as a leak current so that intended operations of the semiconductor device are ensured, and the yield is improved.

Preferably, the void extends from a position between the first insulating films to a position between the two conductive layers.

In this case, the void located between the two conductive layers reduces a capacitance between the two conductive layers so that the operation speed of the semiconductor device can be increased.

More preferably, the semiconductor device includes an element formation region crossing the two conductive layers, and isolated by the first insulating film, an impurity region on one side of a predetermined conductivity type formed in the element formation region on the side remote from one of the two conductive layers and near the other conductive layer, and another impurity region on a different side of a predetermined conductivity type formed in the element formation region on the side remote from the other conductive layer. The conductive layer includes a first electrode portion formed on the element formation region, and a second electrode portion formed on the first electrode portion.

According to the above aspect, a semiconductor element including the first and second electrode portions as well as the impurity regions on the one and the other sides is obtained at the element formation region.

More preferably, the semiconductor device includes a conductive region formed at the surface of the semiconductor substrate located in the region between the two conductive layers, and the conductive region includes the impurity region on the one side.

In the above structure, the impurity region on the one side of the semiconductor element is electrically connected to another portion by the conductive region.

More preferably, the first electrode portion includes a floating gate, the second electrode portion includes a control gate, the impurity region on the one side includes a source region, and the impurity region on the other side includes a drain region.

In this structure, a memory cell including the floating gate, control gate, source region and drain region is formed as a semiconductor element.

According to a second aspect of the invention, a semiconductor device includes a semiconductor substrate, a groove, an element isolation insulating film, an element formation region, a first gate interconnection, a second gate interconnection, a source region, a drain region, a conductive region, an opening, an interlayer insulating film and a void. The groove is formed at the semiconductor substrate. The element isolating and insulating film fills the groove. The element formation region is formed at the semiconductor substrate, and is isolated by the element isolating and insulating film. The first gate interconnection is formed across the element isolating and insulating film and the element formation region, and includes a floating gate electrode and a control gate electrode. The second gate interconnection is formed across the element isolating and insulating film and the element formation region, is spaced from the first gate interconnection, and includes the floating gate electrode and the control gate electrode. The source region is formed in the element formation region located between the first and second gate interconnections. The drain region is formed in the element formation region spaced from the source region with the first gate interconnection therebetween. The conductive region includes the source region, and is formed in a region of the semiconductor substrate located between the first and second gate interconnections. The opening is formed in the element isolating and insulating film located between the first and second gate interconnections, and exposes the surface of the semiconductor substrate forming the groove. The interlayer insulating film fills the opening, covers the first and second gate interconnections and is formed on the semiconductor substrate. The void is formed in the opening filled with the element isolating and insulating film.

According to this structure, the memory cell including the floating gate, control gate, source region and drain region can be configured such that the void formed in the opening reduces a stress acting on the semiconductor substrate, which is located on the bottom of the opening, during the manufacturing after formation of the interlayer insulating film. In the completed semiconductor device, the above void reduces the stress acting on the semiconductor substrate. Thereby, occurrence of crystal defects in the semiconductor substrate is suppressed, and disadvantages such as a leak current can be prevented so that intended operations of the memory cell can be ensured, and the yield of the semiconductor device can be improved.

Preferably, the void extends from a position between the element isolating and insulating films to a position between the first and second gate interconnections.

In this structure, the void located between the first and second gate interconnections reduces the line-to-line capacitance between the first and second gate interconnections so that the semiconductor device can operate fast.

According to a third aspect of the invention, a semiconductor device includes a semiconductor substrate, a first insulating film, two interconnections, an opening, a second insulating film and a void. The first insulating film is formed on the semiconductor substrate. The two interconnections are formed on the first insulating film with a space between each other. The opening is formed at the first insulating film located between the two interconnections, and exposes the surface of the semiconductor substrate. The second insulating film fills the opening, covers the interconnections and is formed on the semiconductor substrate. The void is formed in the opening filled with the second insulating film.

According to this structure, the void formed in the opening reduces a stress acting particularly on the semiconductor substrate, which is located on the bottom of the opening, during the manufacturing after formation of the second insulating film. In the completed semiconductor device, the above void reduces the stress acting on the semiconductor substrate. Thereby, occurrence of crystal defects in the semiconductor substrate is suppressed, and disadvantages such as a leak current can be prevented so that intended operations can be ensured, and the yield of the semiconductor device can be high.

Preferably, the void extends from a position between the first insulating films to a position between the two interconnections.

In this structure, the void located between the two interconnections reduces the line-to-line capacitance between the two interconnections so that the semiconductor device can operate fast.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
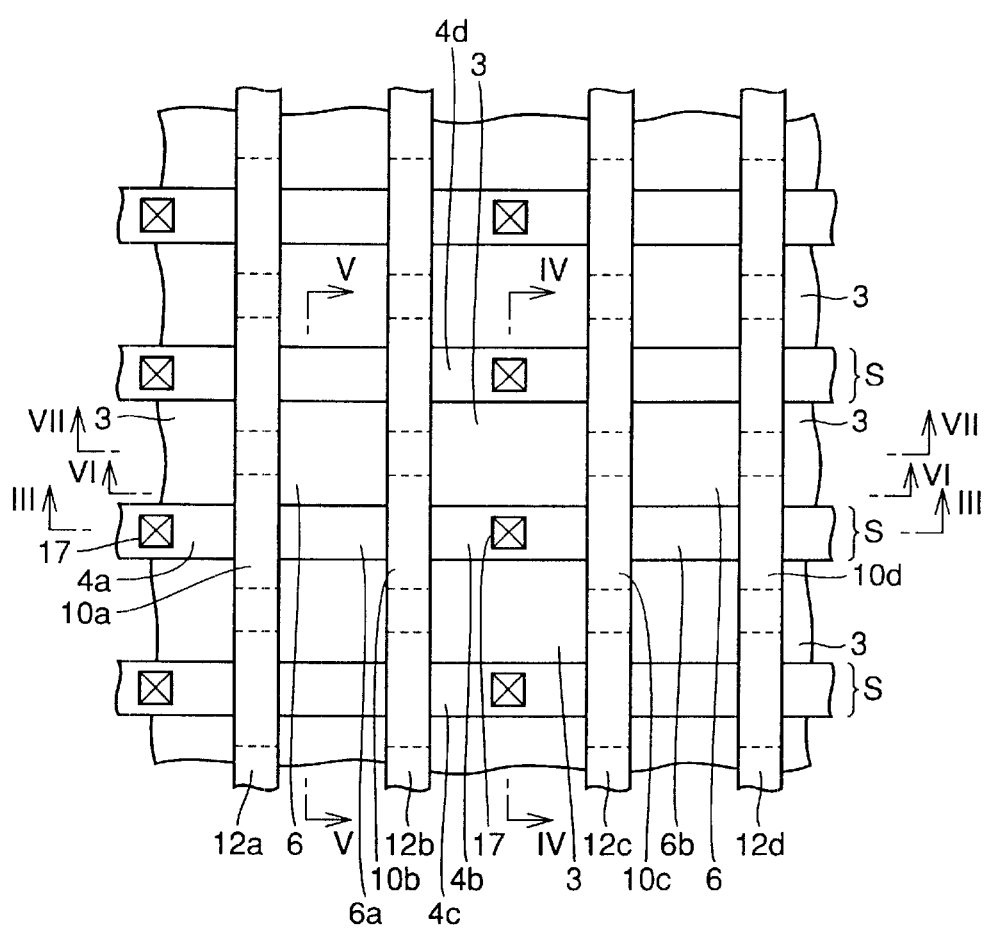
FIG. 1 shows a planar structure of a memory cell region of a flash memory according to a first embodiment of the invention.
Figure 2:
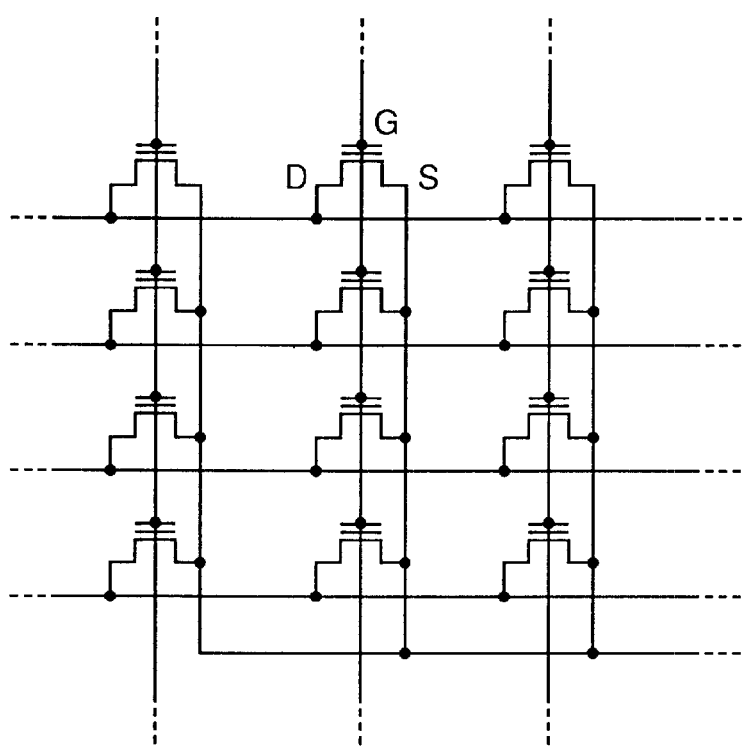
FIG. 2 shows an equivalent circuit of memory cells in the first embodiment.

A flash memory according to a first embodiment of the invention will now be described. A planar structure and an equivalent circuit of memory cells in the flash memory are shown in FIGS. 1 and 2, respectively. As shown in FIG. 1, a plurality of element formation regions S are formed in portions of a surface of a silicon substrate divided by trench isolating oxide films 3. Floating gate electrodes 10a–10d are formed across element formation regions S. Control gate electrodes 12a–12d are formed on floating gate electrodes 10a–10d, respectively.

A source region 6a is formed in a region located between control gate electrodes 12a and 12b. A drain region 4b is formed in element formation region S spaced from source region 6a with control gate electrode 12b therebetween. These floating gate electrode 10b, control gate electrode 12b, source region 6a and drain region 4b form one memory cell.

Drain region 4b of this memory cell is electrically connected to a drain region of another memory cell via contact holes 17 and an interconnection, which is not shown in the figure but extends in a row direction (i.e., a direction substantially perpendicular to the extending direction of the control gate electrode), as shown in FIG. 2.

Source region 6a is electrically connected to a source region of another memory cell via a diffusion layer interconnection 6, which extends in the column direction, and is formed in a region of silicon substrate 2 located between control gate electrodes 12a and 12b, as shown in FIG. 2. Thus, diffusion layer interconnection 6 includes the source region.

Figure 3:
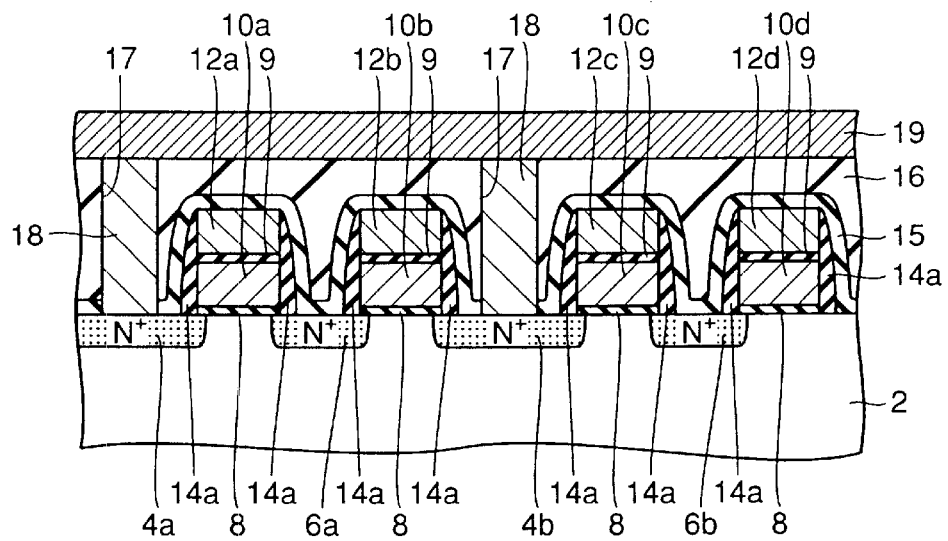
FIGS. 3 to 7 are cross sections taken along lines III—III, IV—IV, V—V, VI—VI and VII—VII in FIG. 1, respectively.

Then, a sectional structure of the memory cell will be described. First, description will be given on a sectional structure of the element formation region taken along line III—III in FIG. 1, which is substantially perpendic to the extending direction of the control gate electrode. As shown FIG. 3, floating gate electrodes 10a, 10b, 10c and 10d are formed on silicon substrate 2 with a tunnel oxide film 8 therebetween.

Control gate electrodes 12a, 12b, 12c and 12d are formed on floating gate electrodes 10a–10d with ONO film 9 therebetween, respectively. Sidewalls 14a are formed on opposite side surfaces of each of floating gate electrodes 10a–10d and control gate electrodes 12a–12d.

Source region 6a is formed at the surface of silicon substrate 2 located between control gate electrodes 12a and 12b. Drain region 4b is formed at silicon substrate 2 located between control gate electrodes 12b and 12c.

A drain region 4a is formed in a region of silicon substrate 2, which is spaced from source region 6a with control gate electrode 12a therebetween. A source region 6b is formed in a region of silicon substrate 2 located between control gate electrodes 12c and 12d.

Control gate electrodes 12a–12d and floating gate electrodes 10a–10d are covered with a TEOS film 15 formed on silicon substrate 2. A BPTEOS film 16 serving as an interlayer insulating film is formed on TEOS film 15. BPTEOS film 16 is provided with contact holes 17 exposing the surfaces of drain regions 4a and 4b. Each contact hole 17 is filled with a plug 18. Metal interconnections 19, each of which is electrically connected to plug 18, are formed on BPTEOS film 16.

Figure 4:
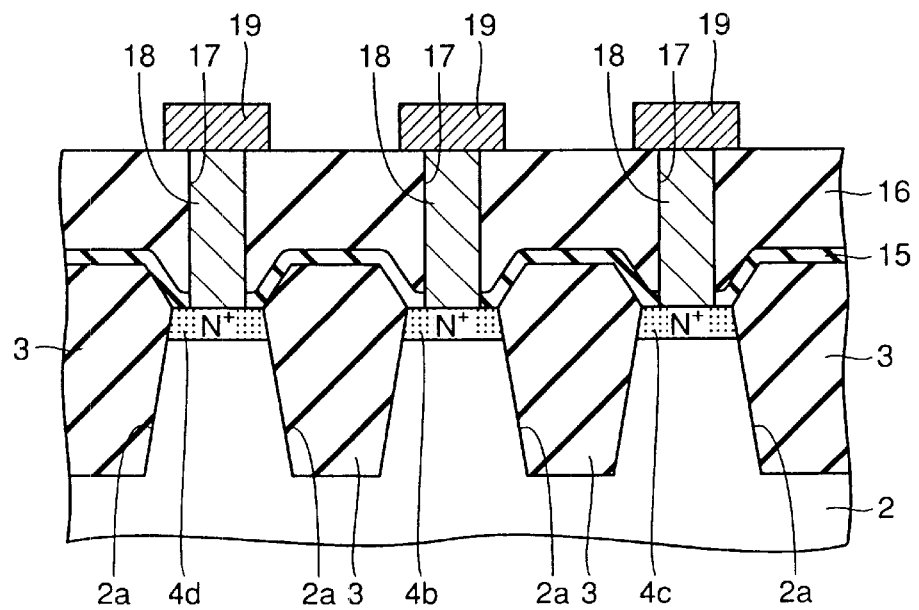

Description will now be given on the drain region formed in each element formation region Sa, and particularly a sectional structure the extending direction of the control gate electrode. As shown in FIG. 4, which is a cross section taken along line IV—IV in FIG. 1, silicon substrate 2 is provided with grooves 2a for forming trench isolating oxide films 3. Trench isolating oxide film 3 fills groove 2a.

Drain regions 4d, 4b and 4c are formed between neighboring trench isolating oxide films 3. BPTEOS film 16 serving as the interlayer insulating film is formed on trench isolating oxide film 3 with TEOS film 15 therebetween. BPTEOS film 16 is provided with contact holes 17, through which the surfaces of drain regions 4d, 4b and 4c are exposed.

Plug 18 is formed in each contact hole 17. Metal interconnection 19 is formed on BPTEOS film 16, and is electrically connected to plug 18.

Figure 5:
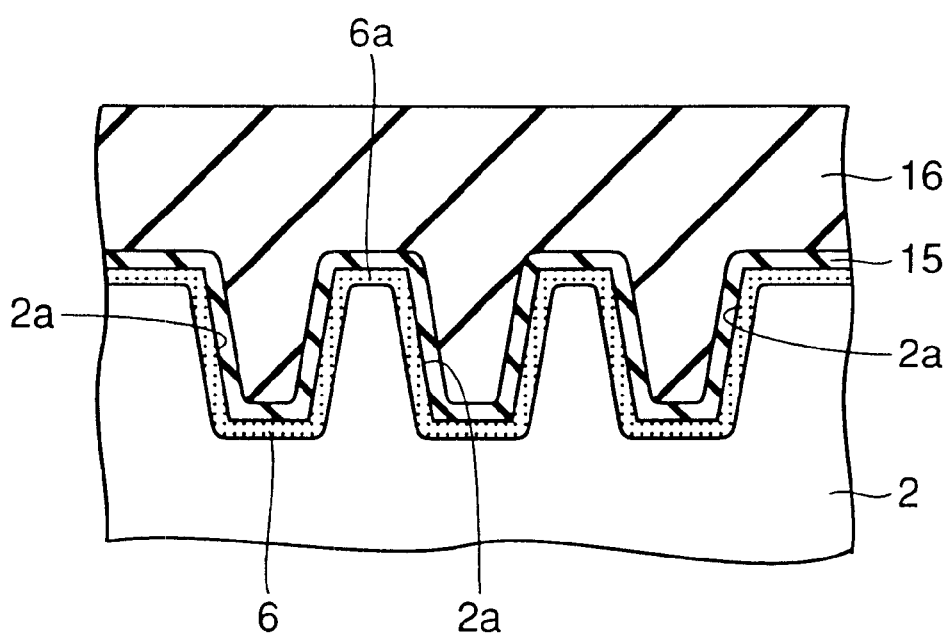

Description will now be given on the source region formed in the element formation region, and particularly a sectional structure along the extending direction of the control gate electrode. As shown in FIG. 5, which is a cross section taken along line V—V in FIG. 1, silicon substrate 2 is provided with grooves 2a for forming the trench isolating oxide films. Diffusion layer interconnection 6 is formed on the surface of silicon substrate 2 including the surfaces of grooves 2a.

Diffusion layer interconnection 6 includes the source regions (e.g., source region 6a). BPTEOS film 16 serving as the interlayer insulating film is formed on silicon substrate 2 with TEOS film 15 therebetween. Thereby, trench isolating oxide film 3 filling groove 2a is removed from the region where the source region is formed.

Figure 6:
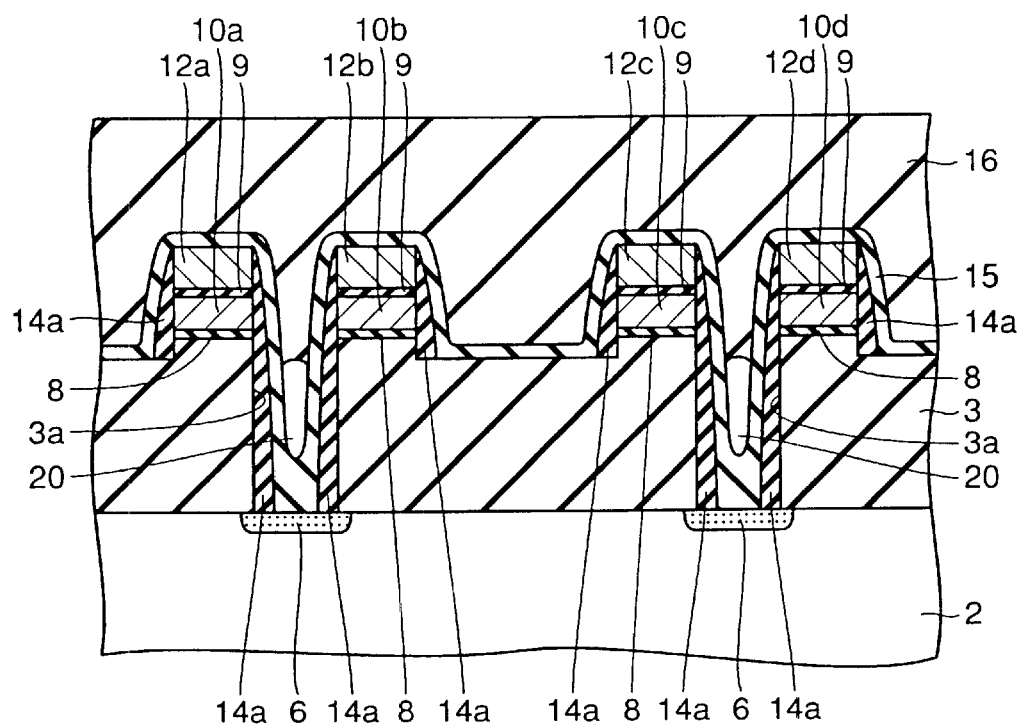

Description will now be given on a sectional structure of a region, which is provided with trench isolating oxide film 3, and extends perpendicularly to the extending direction of the control gate electrode. This section is located relatively near the element formation region. As shown in FIG. 6, which is a cross section taken along line VI—VI in FIG. 1, the groove formed in silicon substrate 2 is filled with trench isolating oxide film 3.

Floating gate electrodes 10a–10d are formed on trench isolating oxide film 3 with tunnel oxide film 8 therebetween. Control gate electrodes 12a–12d are formed on floating gate electrodes 10a–10d with ONO film 9 therebetween, respectively.

Opening 3a which exposes the surface of silicon substrate 2 (groove 2a) is formed in a region located between control gate electrodes 12a and 12b. Likewise, opening 3a which exposes the surface of silicon substrate 2 (groove) is formed in the region located between control gate electrodes 12c and 12d. Diffusion layer interconnection 6 including the source region is formed at the surface of silicon substrate 2 exposed on the bottom of each opening 3a.

Side wall insulating films 14a are formed on side surfaces of control gate electrodes 12a–12d and floating gate electrodes 10a–10d including the side surfaces of openings 3a. Side wall insulating films 14a are covered with TEOS film 15. BPTEOS film 16 serving as the interlayer insulating film is formed on TEOS film 15. A void 20 is formed within each opening 3a partially filled with TEOS film 15 and BPTEOS film 16.

Figure 7:
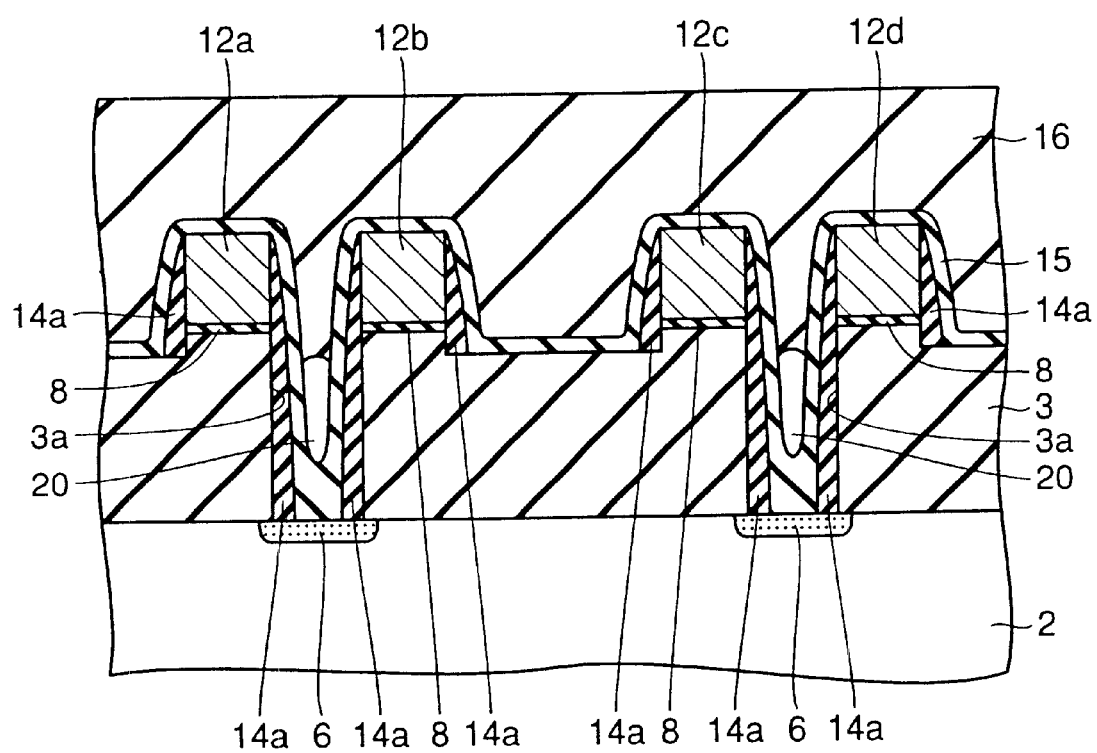

Description will now be given on a sectional structure of a region, which is provided with the trench isolating oxide film, and extends in the direction perpendicular to the extending direction of the control gate electrode. This section which is taken along line VII—VII is located relatively remote from the element formation region. As shown in FIG. 7, the floating gate electrode is not present under control gate electrodes 12a–12d in this section. Thus, control gate electrodes 12a–12d in this section are located on trench isolating oxide film 3 with ONO film 9 therebetween.

Opening 3a exposing the surface of silicon substrate 2 (groove) is formed in each of regions located between control gate electrodes 12a and 12b and between control gate electrodes 12c and 12d. Side wall insulating films 14a are formed on the side surfaces of control gate electrodes 12a–12d including the side surfaces of openings 3a.

BPTEOS film 16 filling openings 3a is formed over control gate electrodes 12a–12d with TEOS film 15 therebetween. As already described, void 20 is formed within each opening 3a filled with TEOS film 15 and BPTEOS film 16.

Portions of control gate electrodes 12a–12d, which are located in regions extending along the section in FIG. 7, are configured to fill relatively narrow portions between the neighboring floating gate electrodes, and therefore each have a thickness nearly equal to a sum of thicknesses of the floating gate electrode and the control gate electrode shown in FIG. 6.

Openings 3a, which are formed in regions between control gate electrodes 12a–12d, and expose the surface of silicon substrate 2 (grooves 2a) as shown in FIGS. 6 and 7, are provided for forming diffusion layer interconnections 6 including the source regions at silicon substrate 2, as will be described later.

In a manufacturing step after filling opening 3a with TEOS film 15 and BPTEOS film 16, a strong stress acts on silicon substrate 2 located on the bottom of opening 3a. In this situation, void 20a formed in opening 3a can reduce the stress acting on silicon substrate 2. Owing to reduction in stress acting on silicon substrate 2, it is possible to suppress occurrence of crystal defects in silicon substrate 2, and therefore disadvantages such as occurrence of a leak current due to the crystal defects can be prevented. As a result, reliability of the operation is ensured, and the yield of the flash memory can be high.

Figure 8:
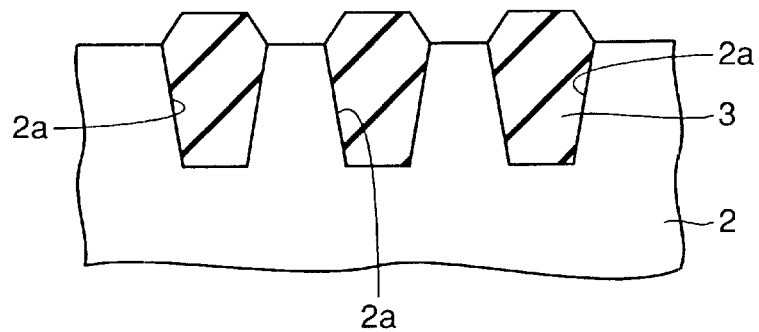
FIGS. 8 and 9 are cross sections taken along lines V—V and VII—VII, respectively, and showing steps in a method of manufacturing the flash memory of the first embodiment.
Figure 9:
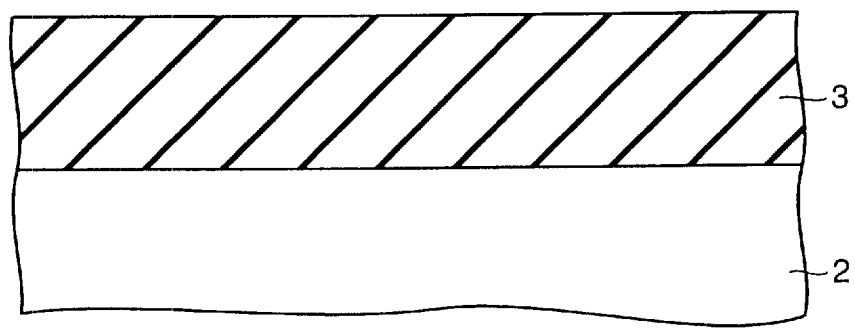

An example of a method of manufacturing the flash memory described above will now be described in connection with sectional structures, which are shown in cross sections taken along lines V—V and VII—VII in FIG. 1, respectively. First, as shown in FIGS. 8 and 9, etching is effected on a predetermined region of silicon substrate 2 so that grooves 2a of about 300–400 nm in thickness are formed for forming the trench isolating oxide films. Silicon oxide films are formed within grooves 2a to form trench isolating-oxide films 3, respectively.

Figure 10:
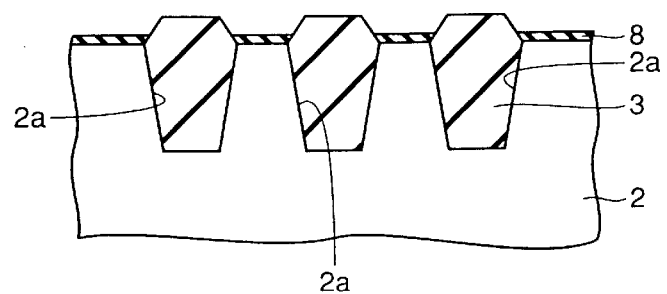
FIGS. 10 to 23 are cross sections showing steps in the first embodiment performed after the steps shown in FIGS. 8 to 21, respectively.
Figure 11:
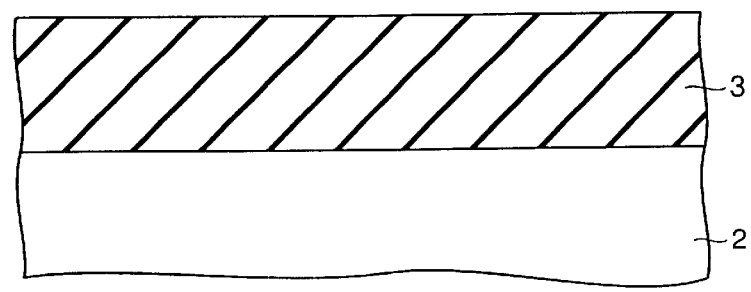
Figure 12:
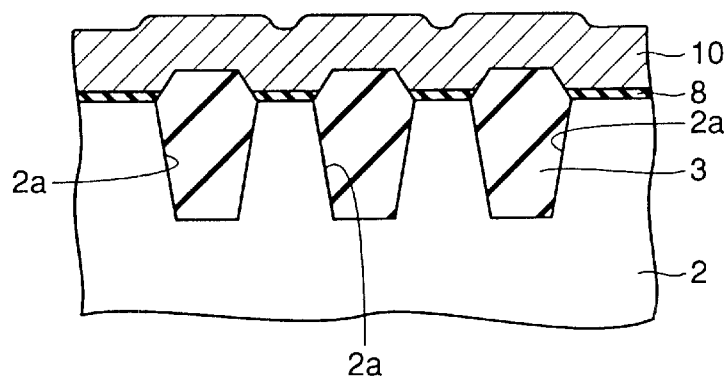
Figure 13:
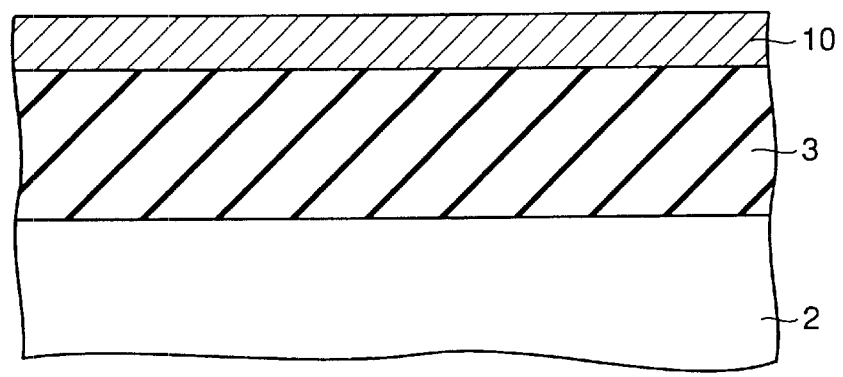

Then, as shown in FIGS. 10 and 11, tunnel oxide film 8 which will form the gate insulating film is formed at the exposed surface of silicon substrate 2. As shown in FIGS. 12 and 13, a CVD method or the like is executed to form a polycrystalline silicon film 10 of about 100 nm in thickness, which will form the floating gate electrodes, on silicon substrate 2.

Figure 14:
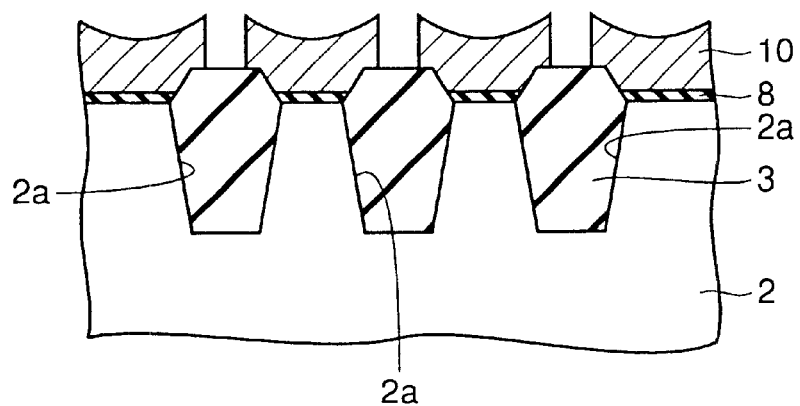
Figure 15:
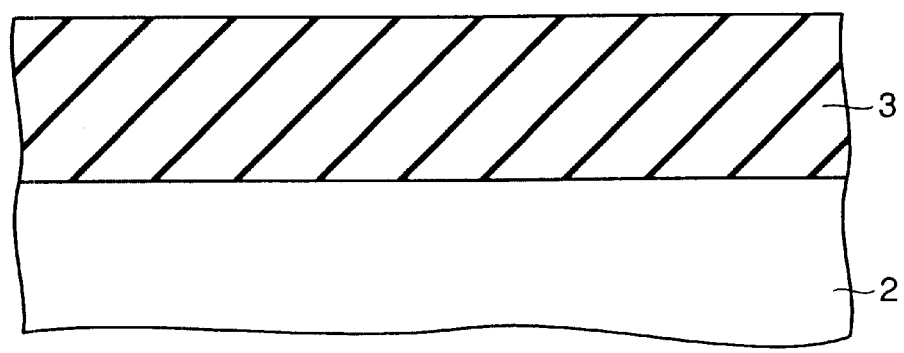

As shown in FIGS. 14 and 15, a predetermined photoresist pattern (not shown) is then formed on polycrystalline silicon film 10, and etching for forming the floating gate electrodes is effected on polycrystalline silicon film 10 masked with the photoresist pattern. After this patterning, polycrystalline silicon film 10 which will form the floating gate electrodes takes the form of stripes extending substantially. perpendicularly to the extending direction of the control gate electrode shown in FIG. 1.

Figure 16:
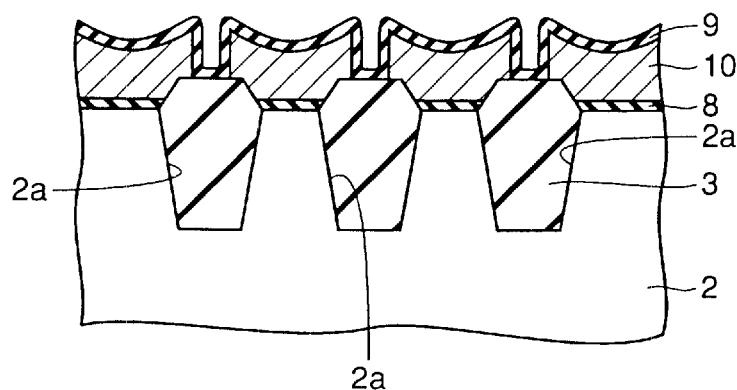
Figure 17:
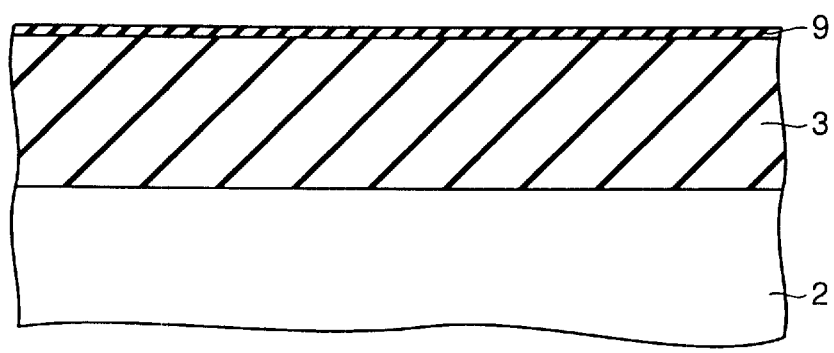

As shown in FIGS. 16 and 17, the CVD method or the like is executed to form ONO film 9, which a layered film of a silicon oxide film and a silicon nitride film, on polycrystalline silicon film 10 which will form the floating gate electrodes. Thereafter, ONO film 9 and polycrystalline silicon film 10, which will form the floating gate electrodes, are removed from a peripheral circuit region (not shown) other than the memory cells. Further, the gate oxide film for forming transistors is formed in the peripheral circuit region.

Figure 18:
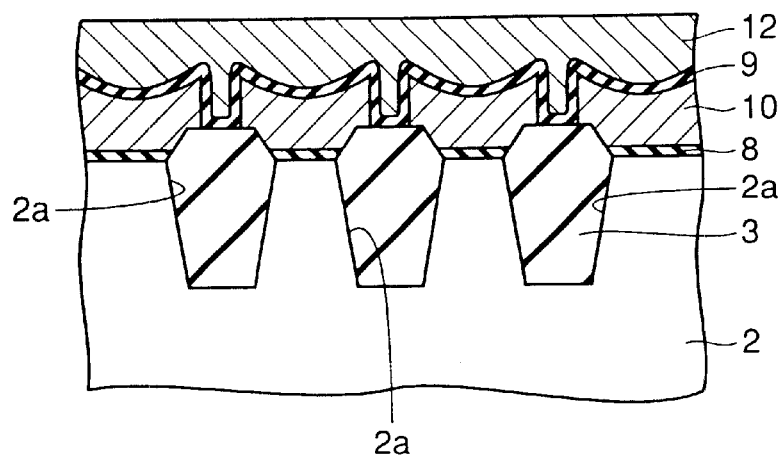
Figure 19:
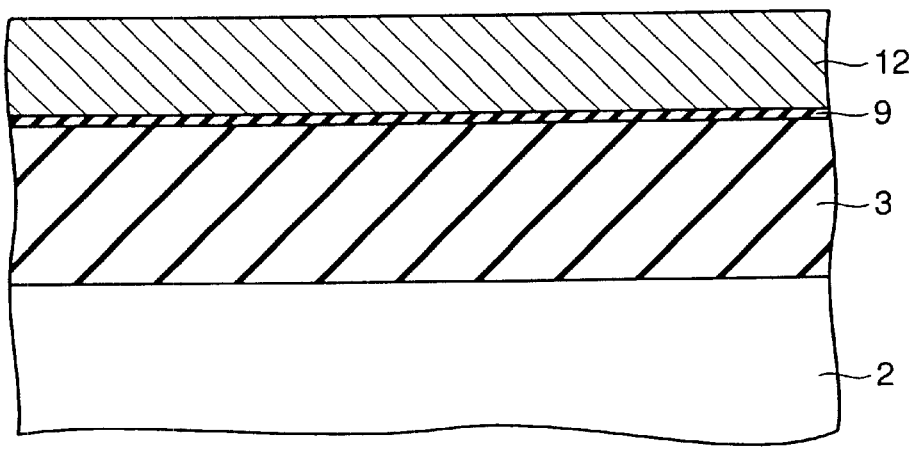

As shown in FIGS. 18 and 19, a polycide film 12 which will form the control gate electrodes, and has a polycide structure formed of, e.g., a tungsten silicide film and a polycrystalline silicon film is formed on ONO film 9. Polycide film 12 has a thickness of about 150–200 nm.

Figure 20:
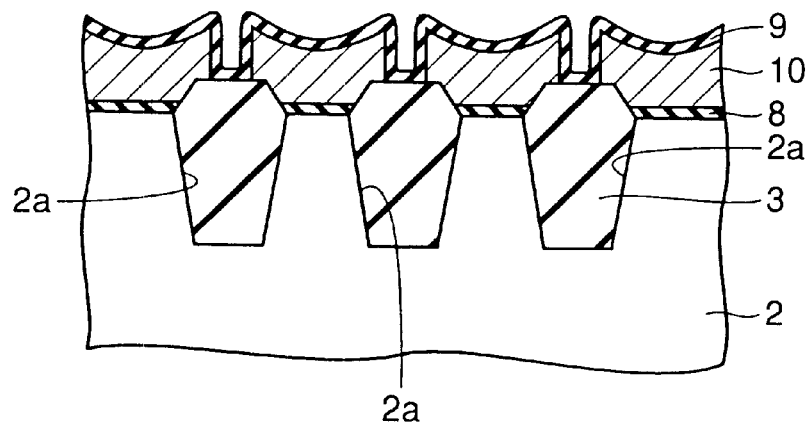
Figure 21:
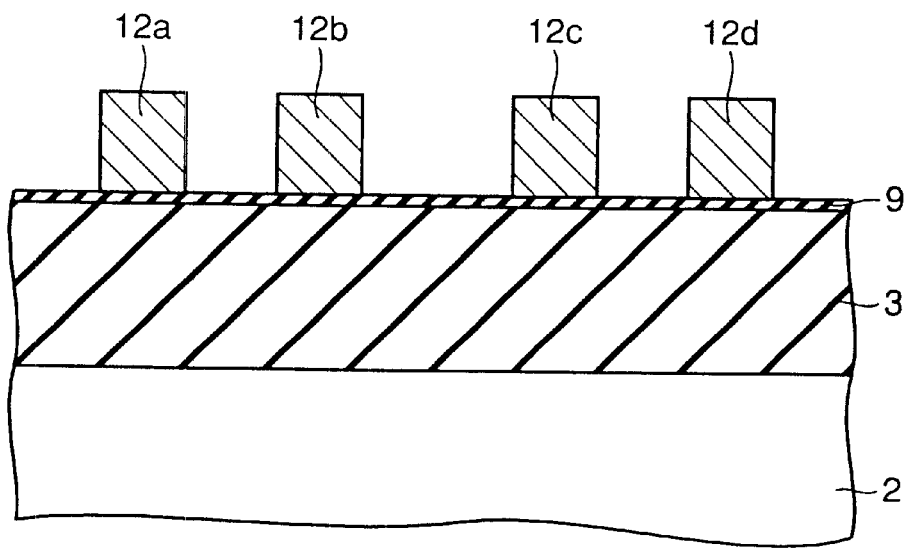

As shown in FIGS. 20 and 21, a predetermined photoresist pattern (not shown) is formed on polycide film 12, and etching is effected on polycide film 12 masked with the photoresist pattern to form control gate electrodes 12a–12d. Then, a predetermined photoresist pattern (not shown) is formed. Using this photoresist pattern as a mask, etching is effected on ONO film 9 and polycrystalline silicon film 10 forming the floating gate electrodes to form the floating gate electrodes.

Figure 22:
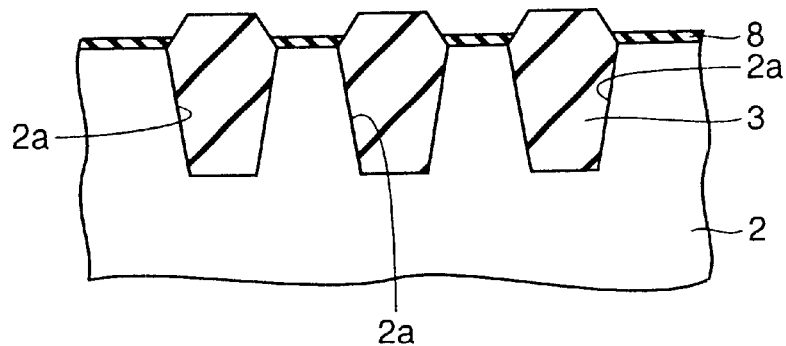
Figure 23:
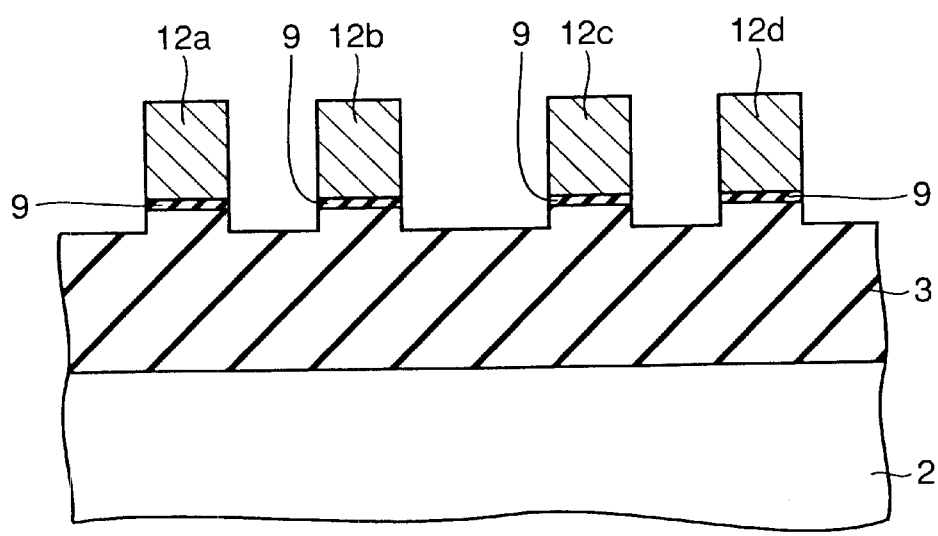

In this stage, floating gate electrodes 10a–10d shown in FIG. 1 are formed, the ONO film and the polycrystalline silicon film forming the floating gate electrode are not present in the structure taken along line V—V, as shown in FIG. 22. In the section taken along line VII—VII, control gate electrodes 12a–12d are formed on trench isolating oxide film 3 with ONO film 9 therebetween.

Figure 24:
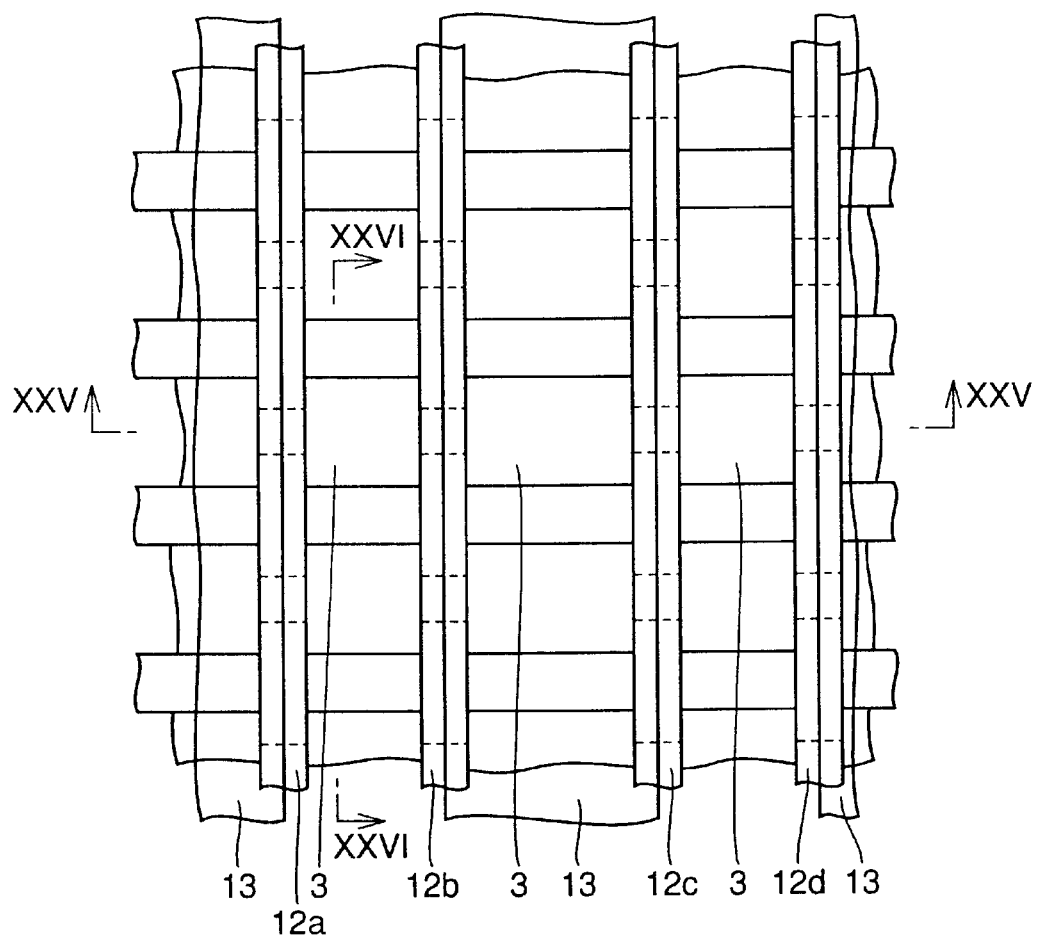
FIG. 24 is a plan showing a step in the first embodiment performed after the steps shown in FIGS. 22 and 23.
Figure 25:
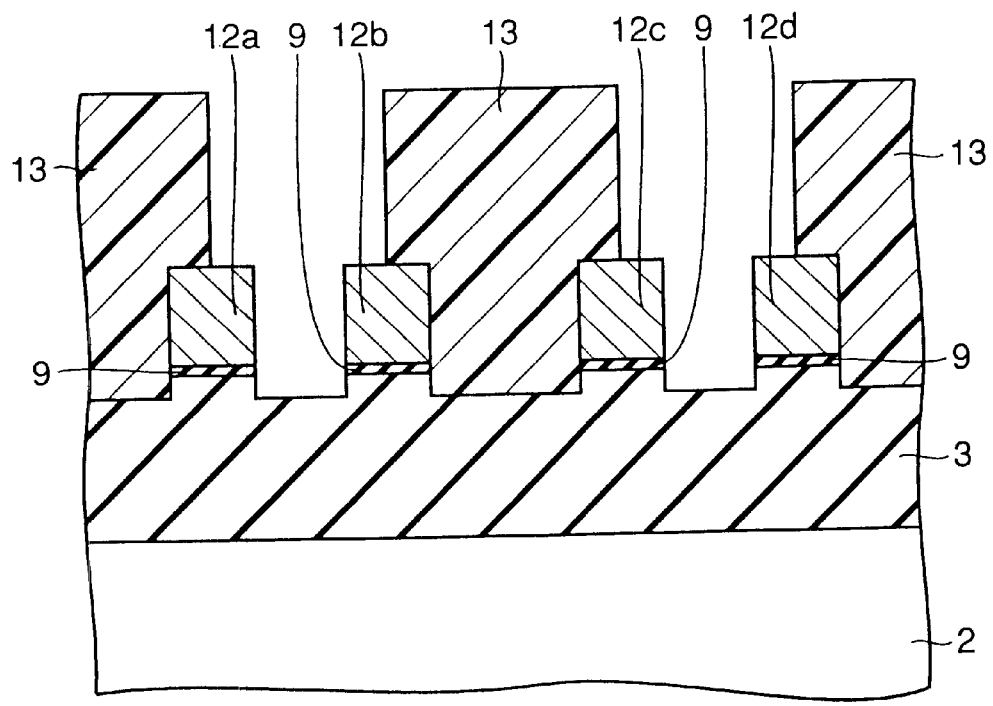
FIG. 25 is a cross section taken along line XXV—XXV in FIG. 24 and showing the first embodiment.

As shown in FIGS. 24 and 25, a predetermined photoresist pattern 13 extending in the substantially same direction as control gate electrodes 12a–12d are formed on silicon substrate 2, on which control gate electrodes 12a–12d are formed. Photoresist pattern 13 covers, e.g., a region located between control gate electrodes 12b and 12c. Photoresist pattern 13 does not cover the region located between control gate electrodes 12a and 12b.

Figure 26:
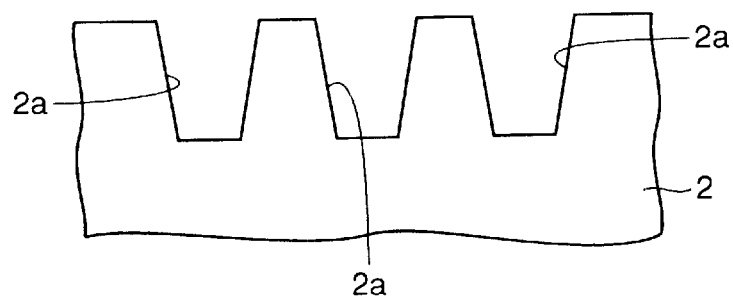
FIG. 26 is a cross section taken along line XXVI—XXVI in FIG. 24, and showing a step in the first embodiment performed after the steps shown in FIGS. 24 and 25.
Figure 27:
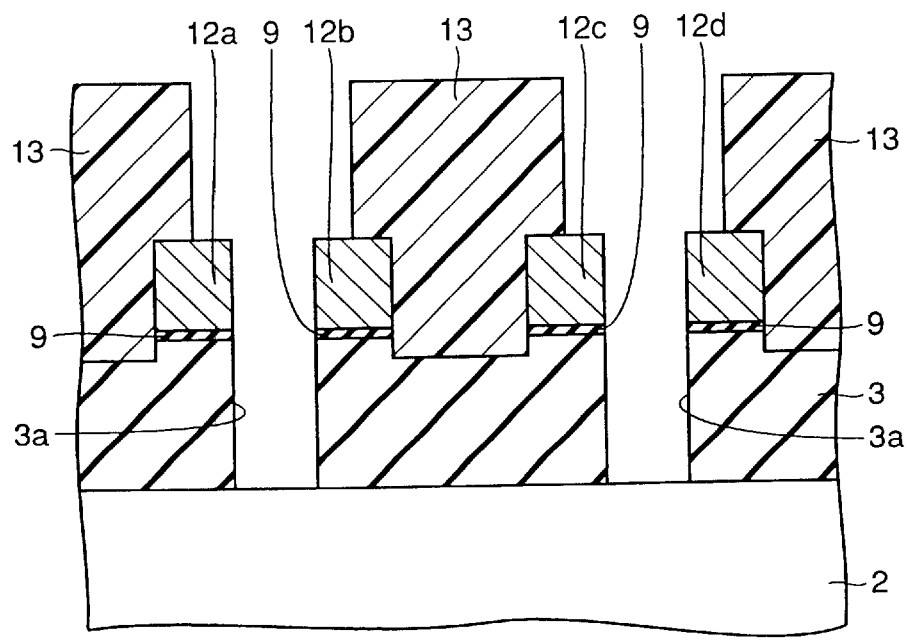
FIGS. 27 to 35 are cross sections showing steps in the first embodiment performed after the steps shown in FIGS. 25 to 33, respectively.

Then, as shown in FIGS. 26 and 27, etching is effected on trench isolating oxide film 3 masked with photoresist pattern 13 and control gate electrodes 12a–12d so that surfaces of grooves 2a are exposed.

Figure 28:
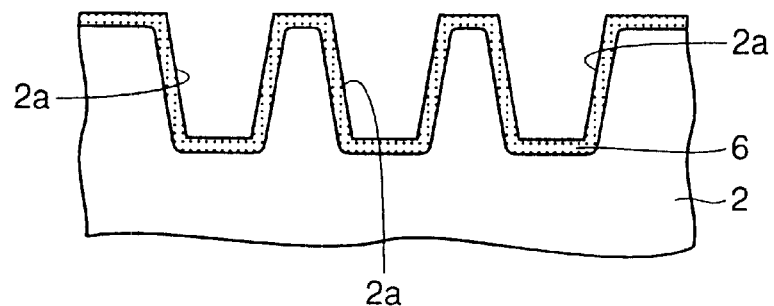
Figure 29:
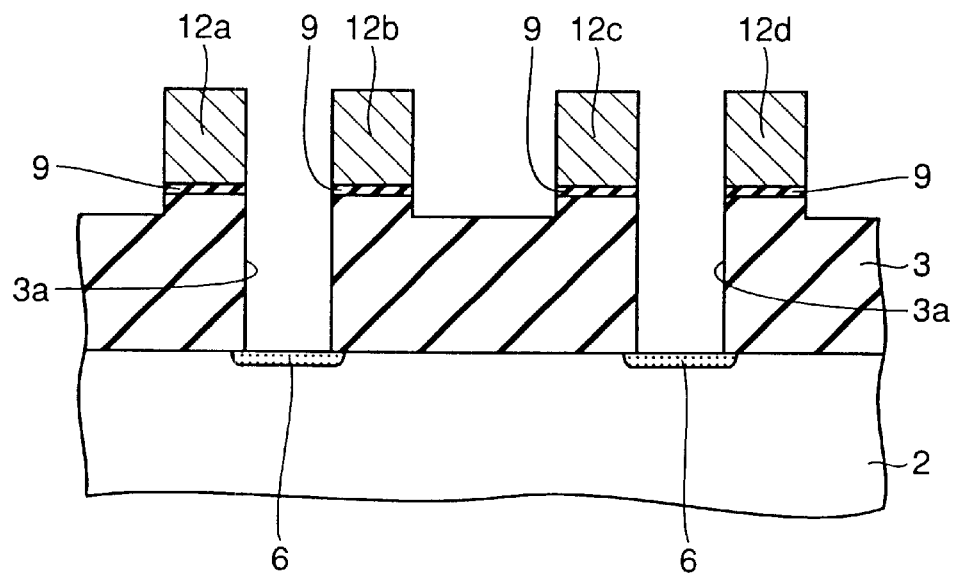

Then, as shown in FIGS. 28 and 29, an ion implanting method is effected to implant ions of a predetermined conductivity type into the surface of silicon substrate 2 including the exposed surfaces of grooves 2a so that diffusion layer interconnections 6 including the source regions are formed. Also, the drain region is formed in the element formation region opposed to the source region with the control gate electrode therebetween.

Figure 30:
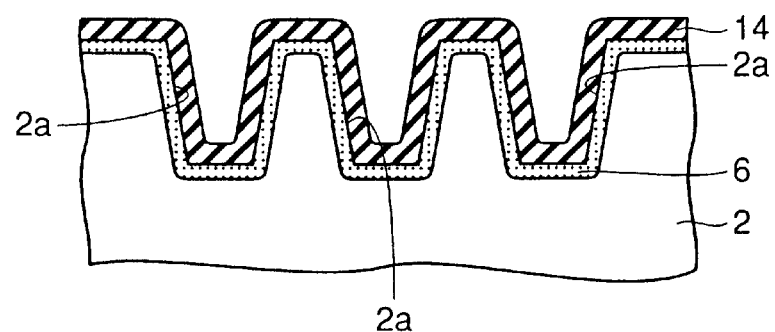
Figure 31:
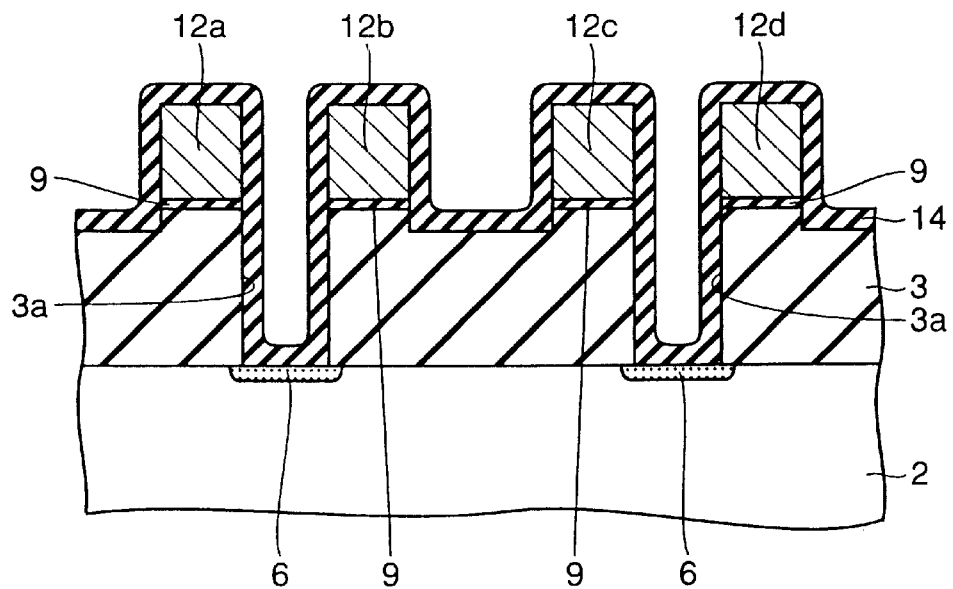
Figure 32:
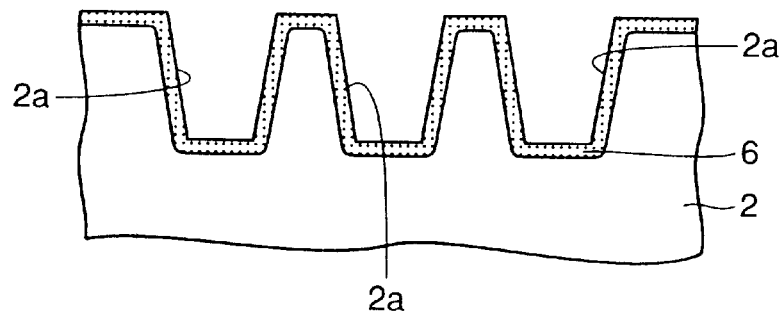
Figure 33:
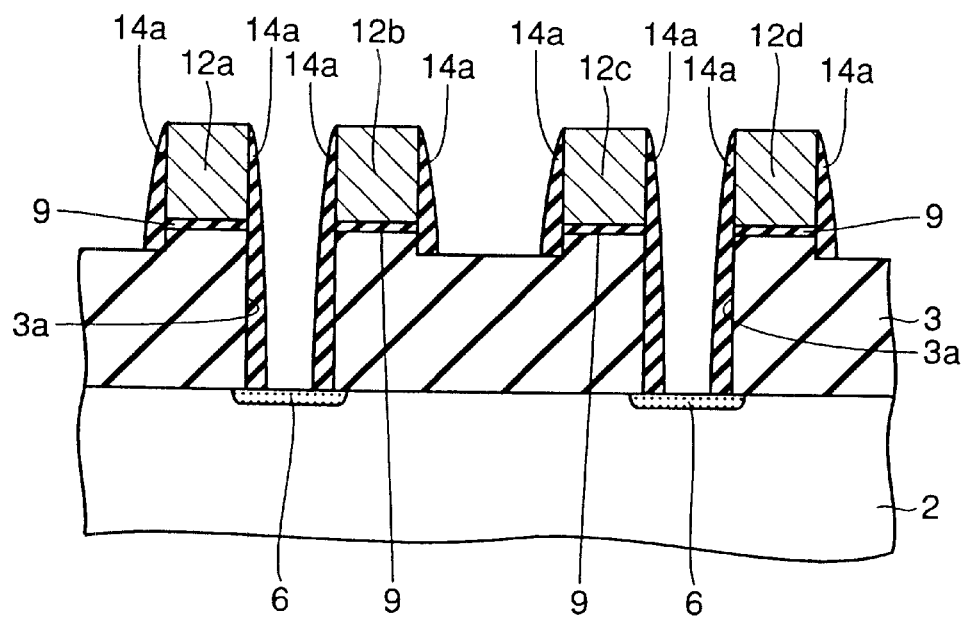
Figure 34:
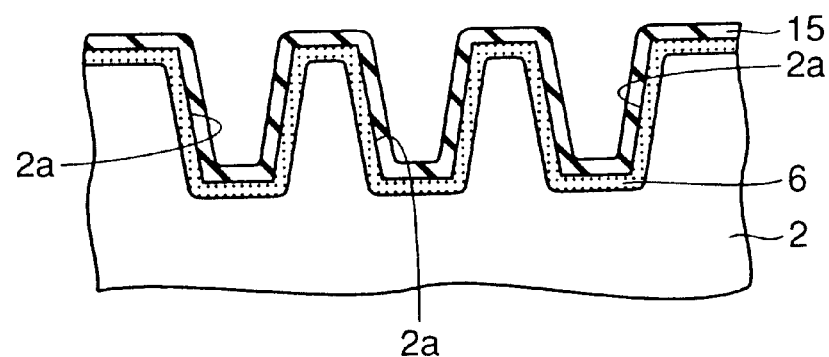
Figure 35:
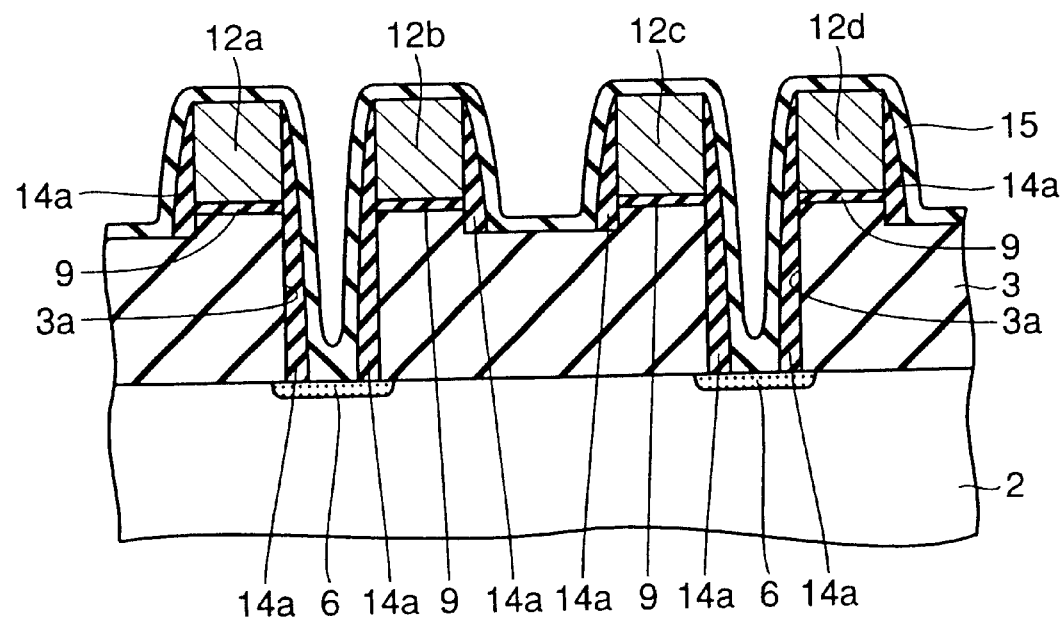

As shown in FIGS. 30 and 31, TEOS film 14 is formed on silicon substrate 2, e.g., by the CVD method. As shown in FIGS. 32 and 33, anisotropic etching is then effected on the whole surface of TEOS film 14 to form sidewall insulating films 14a on the side surfaces of control gate electrodes 12a–12d including the side surfaces of openings 3a. As shown in FIGS. 34 and 35, TEOS film 15 covering control gate electrodes 12a–12d is then formed on silicon substrate 2, e.g., by the CVD method.

Figure 36:
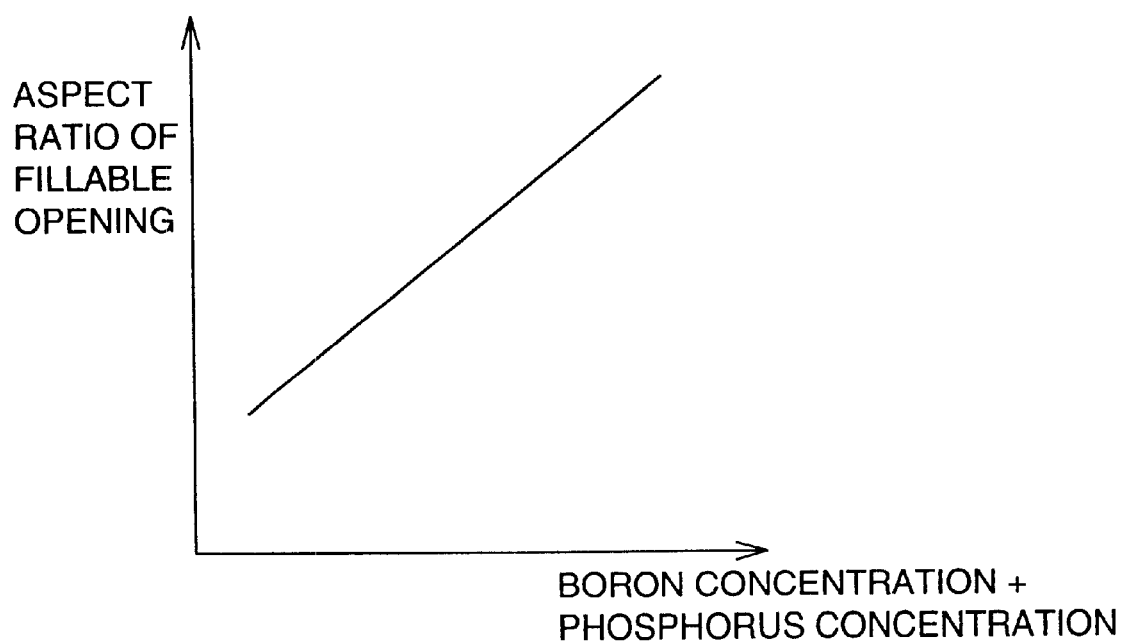
FIG. 36 is a graph showing a relationship between an impurity concentration of a BPTEOS film and an aspect ratio of an opening to be filled in the first embodiment.

Then, the BPTEOS film which will form the interlayer insulating film is formed on TEOS film 15. The BPTEOS film is a TEOS film doped with boron (B) and phosphorus (P). In connection with the process for filling the openings with the BPTEOS film, it is generally known that a higher impurity concentration allows filling of the opening of a higher aspect ratio, as shown in FIG. 36. Conversely, the opening of a large aspect ratio cannot be filled if the impurity concentration is relatively low.

In this flash memory, the above relationship between the impurity concentration of the BPTEOS film and the aspect ratio of the opening which can be filled is utilized for intentionally forming the void within opening 3a formed in trench isolating oxide film 3.

In the above structure, opening 3a has a depth equal to a sum of the depth of groove 2a for forming trench isolating oxide film 3 and the thicknesses of the floating gate electrode and control gate electrode. As described above, groove 2a has a depth in a range from about 300 nm to about 400 nm, and the total thickness of the floating gate electrode and control gate electrode is in a range from about 250 nm to about 300 nm. Therefore, opening 3a has a depth of about 550–700 nm. The depth of opening 3a is about two or three times larger than those of other openings and stepped portions formed on silicon substrate 2, and thus opening 3a forms the deepest opening.

Figure 37:
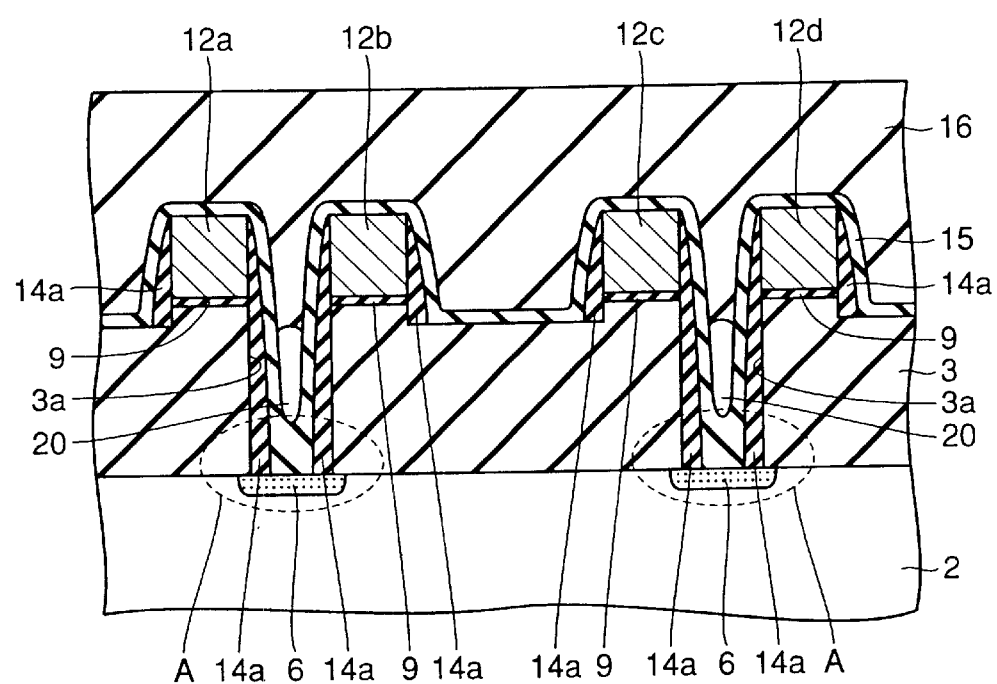
FIG. 37 is a cross section showing a step in the first embodiment performed after the step shown in FIG. 35.
Figure 38:
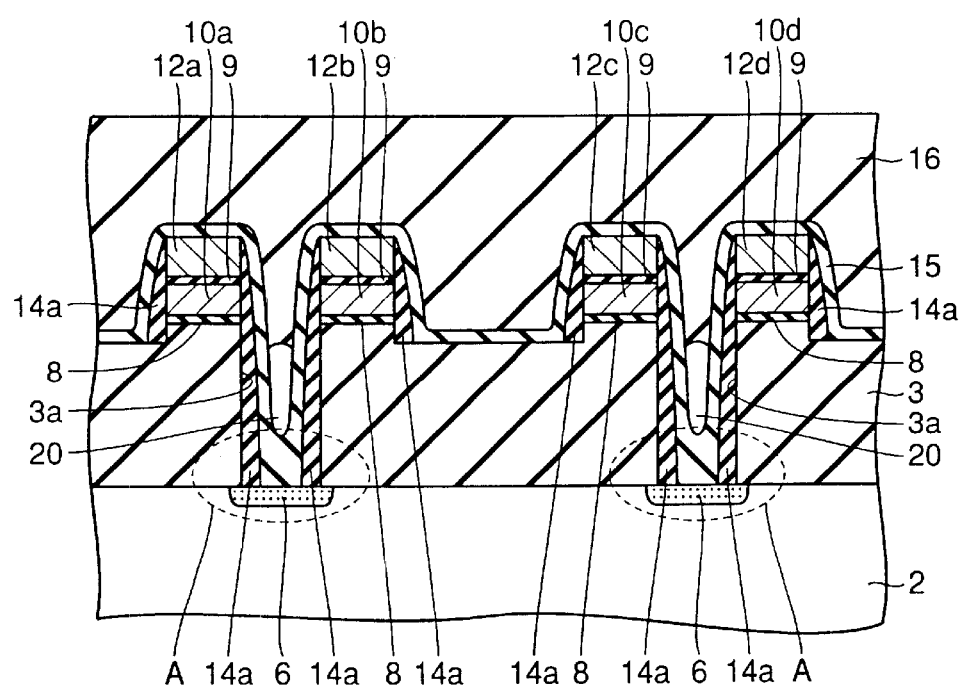
FIG. 38 is a cross section taken along line VI—VI in FIG. 1, and showing a step in the first embodiment performed after the step shown in FIG. 35.

Accordingly, for deteriorating the filling characteristics in opening 3a, BPTEOS film 16 which is doped with boron and phosphorus relatively lightly is formed on TEOS film 15, and thereby void 20 is formed within opening 3a, as shown in FIGS. 37 and 38. Thereafter, BPTEOS film 16 is flattened so that a major portion of the flash memory is completed.

In this flash memory, void 20 formed within opening 3a provides an escape path for the stress, which may act on silicon substrate 2 located at the vicinity of the bottom of opening 3a and particularly surrounded by dotted line A, after the step of forming BPTEOS film 16 so that the stress is reduced. Thereby, occurrence of crystal defects in the silicon substrate is suppressed so that disadvantages such as occurrence of a leak current, which may be caused by occurrence of crystal defects, can are prevented, and the flash memory capable of intended operations is achieved.

Since it is possible to suppress the crystal defects which may occur in the manufacturing step after formation of the BPTEOS film, yield of the flash memory is improved. In the completed flash memory, it is possible to reduce, e.g., a heat and a stress so that the reliability of the operation of the flash memory is improved.

By appropriately selecting the boron concentration and phosphorus concentration of the BPTEOS film, voids 20 are formed only within deepest openings 3a, and shallow openings and stepped portions other than openings 3a can be completely filled with BPTEOS film 16.

Second Embodiment

A flash memory according to a second embodiment of the invention will now be described. In the flash memory according to the first embodiment, void 20 formed within each opening 3a has the top end located at the lower level than the lower ends (lower surfaces) of floating gate electrodes 10a–10d. Thus, void 20 is formed in the position between trench isolating oxide films 3.

Figure 39:
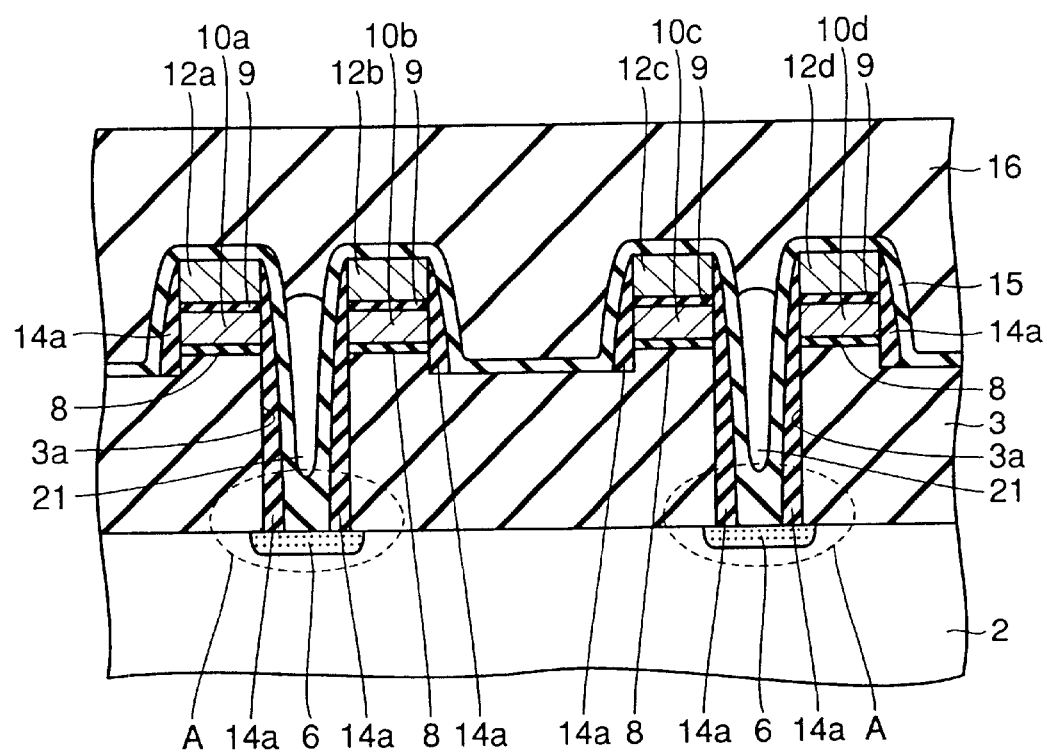
FIG. 39 is a cross section corresponding to that taken along line VI—VI in FIG. 1, and showing a flash memory according to a second embodiment of the invention.
Figure 40:
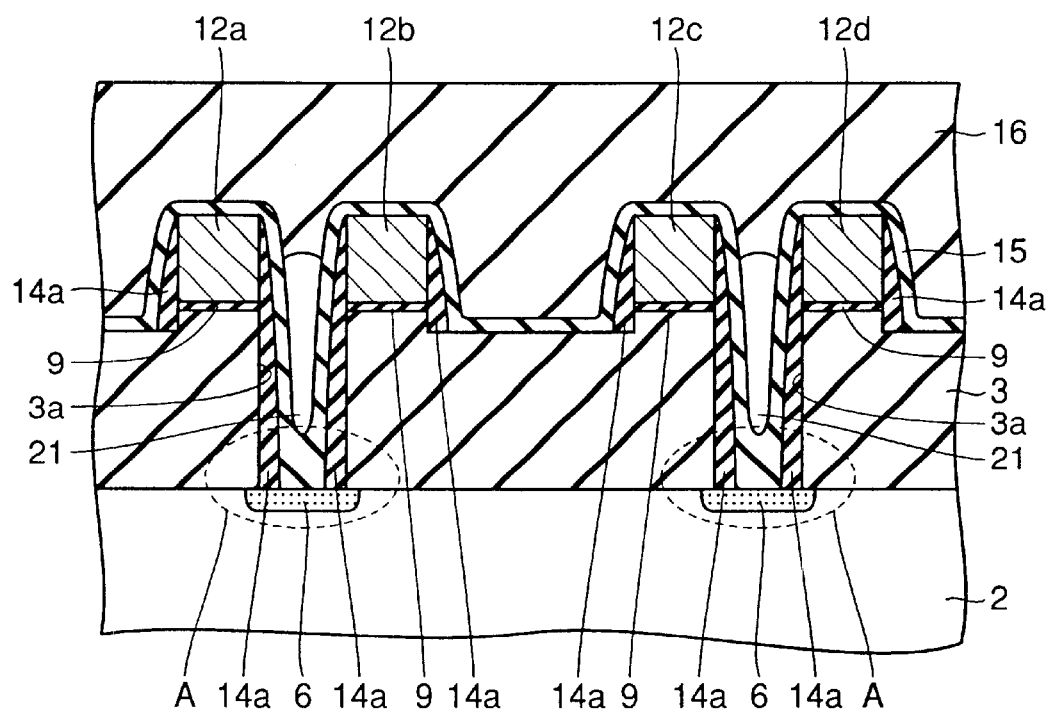
FIG. 40 is a cross section showing the second embodiment and corresponding to that taken along line VII—VII in FIG. 1.

However, in the flash memory of the second embodiment shown in FIGS. 39 and 40, voids 21 extend from positions between trench isolating oxide films 3 to the positions between the floating gate electrodes 10a–10d and control gate electrodes 12a–12d. Structures other than the above are the substantially same as those of the first embodiment. Therefore, the corresponding portions bear the same reference numbers, and description thereof is not repeated.

Description will be given on a method of manufacturing the flash memory described above. For forming void 21 described above, the BPTEOS film having lower filling characteristics is formed after the same step as that in the first embodiment shown in FIG. 35. Thereby, void 21 is formed within opening 3a. More specifically, provision of the BPTEOS film, which contains boron and phosphorus at low concentrations, deteriorates the filling characteristics in opening 3a, and thereby allows formation of large voids 21.

According to this flash memory, as already described with reference to the first embodiment, void 21 can reduce the stress which may be concentrated in the portion surrounded by dotted line A, and thereby can suppress the occurrence of crystal defects in silicon substrate 2. In addition to the above effect of reducing the stress acting on silicon substrate 2, the flash memory of this embodiment can achieve an effect of reducing the capacitance between the gate interconnections.

Figure 41:
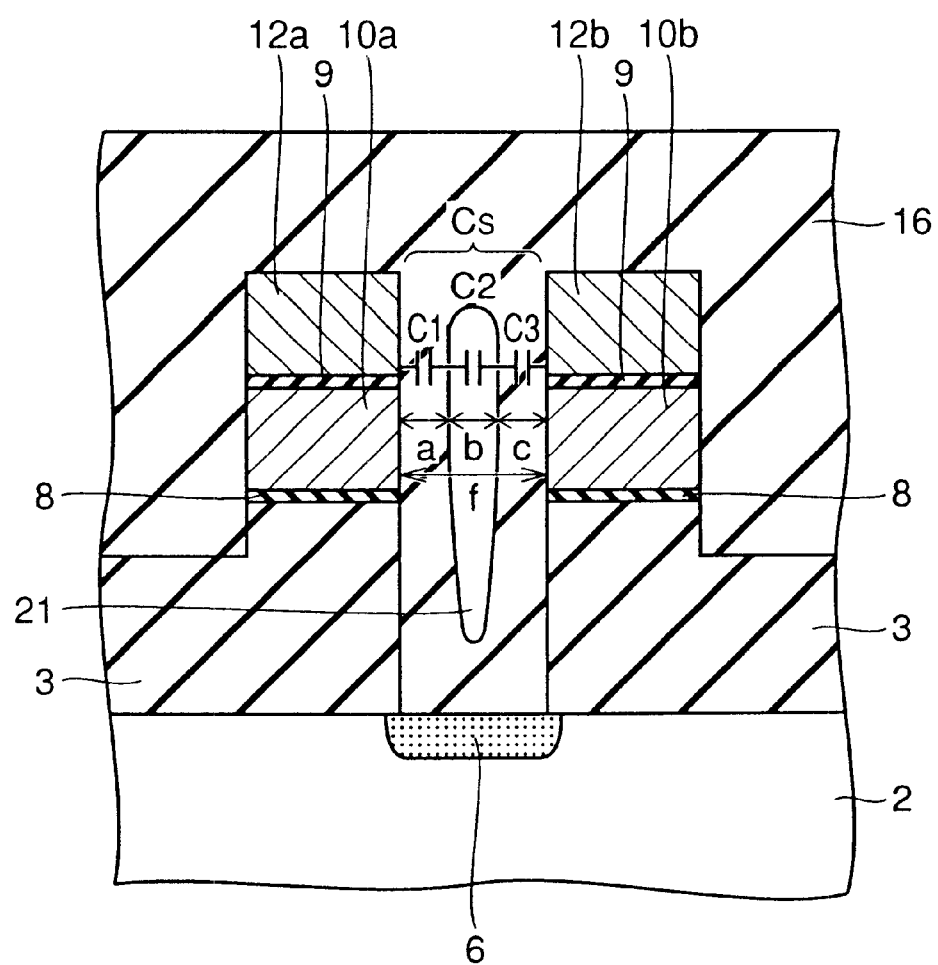
FIGS. 41 and 42 are first and second cross sections each showing capacitances between floating gate electrodes and control gate electrodes.
Figure 42:
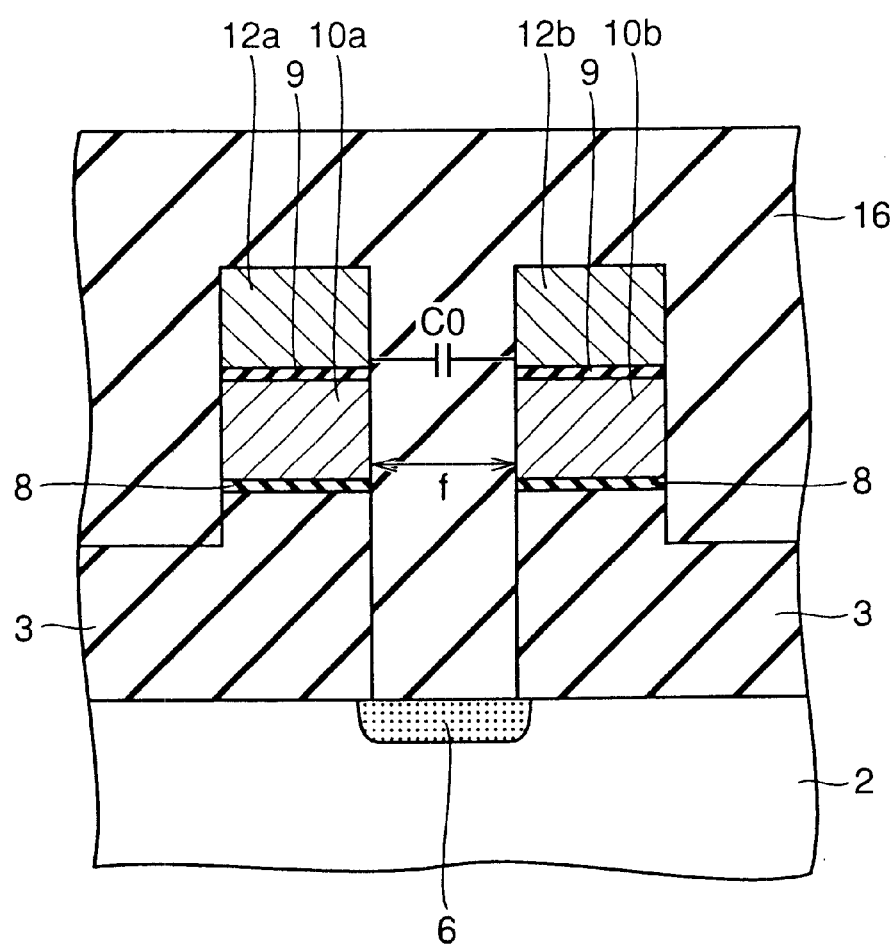
Figure 43:
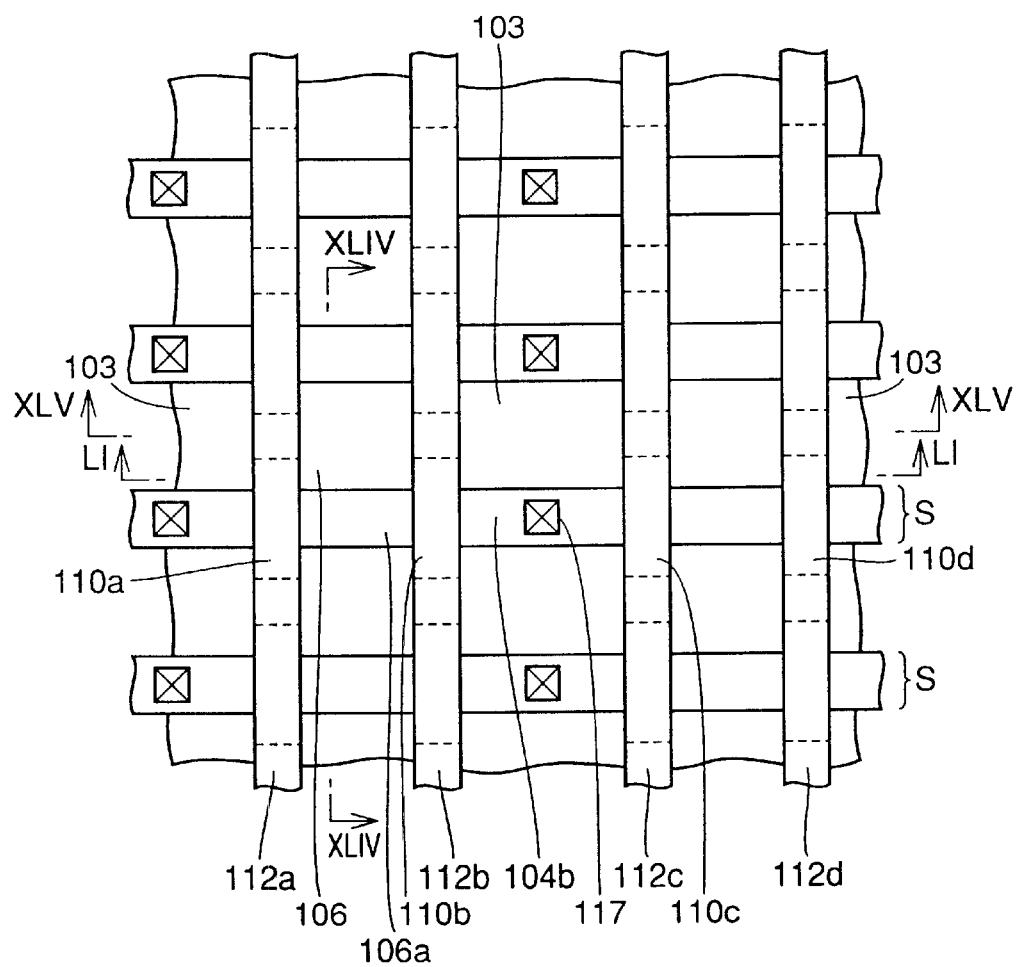
FIG. 43 shows a planar structure of a memory cell region of a conventional flash memory.
Figure 44:
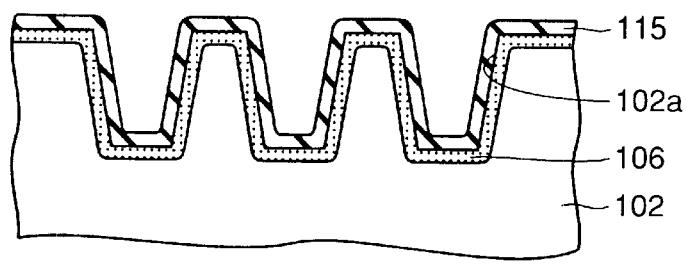
FIG. 44 is a cross section showing a step in a method of manufacturing the conventional flash memory and taken along line XLIV—XLIV in FIG. 43.
Figure 45:
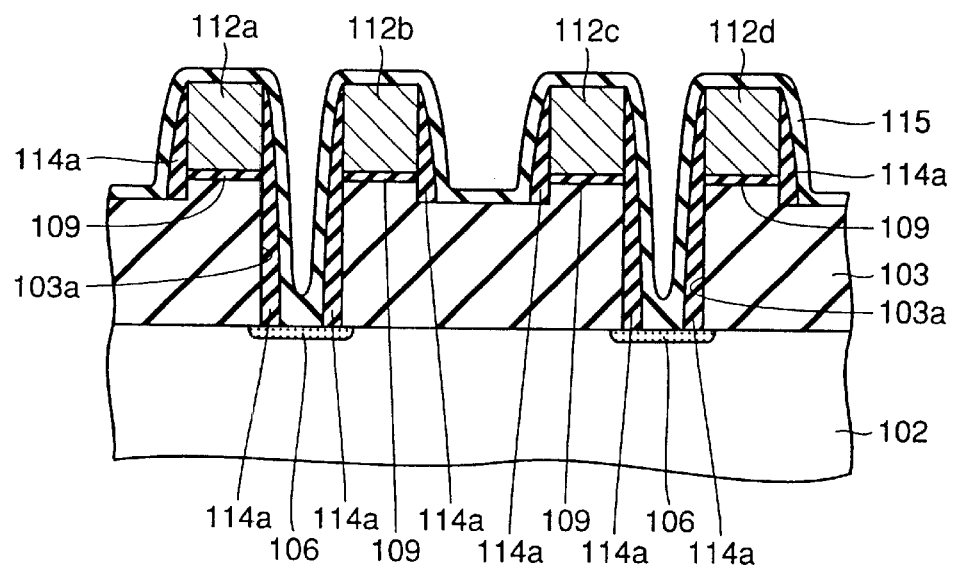
FIG. 45 is a cross section showing a step in a method of manufacturing the conventional flash memory and taken along line XLV—XLV in FIG. 43.
Figure 46:
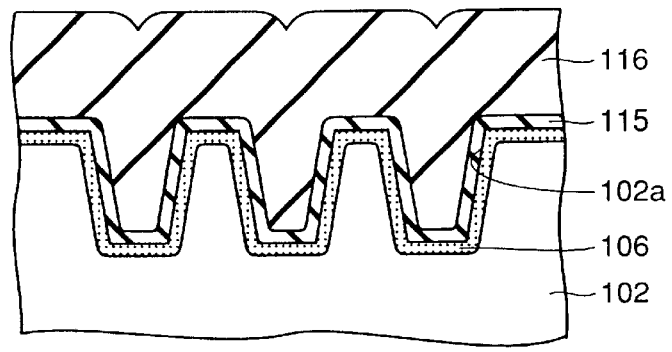
FIGS. 46 to 49 are cross sections showing steps performed after the steps shown in FIGS. 44 to 47, respectively.
Figure 47:
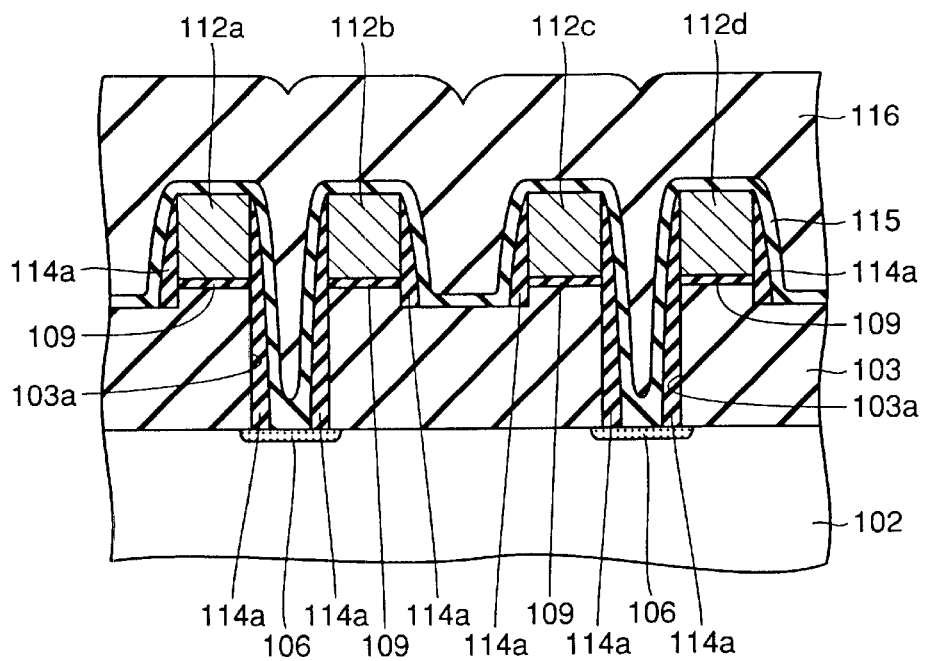
Figure 48:
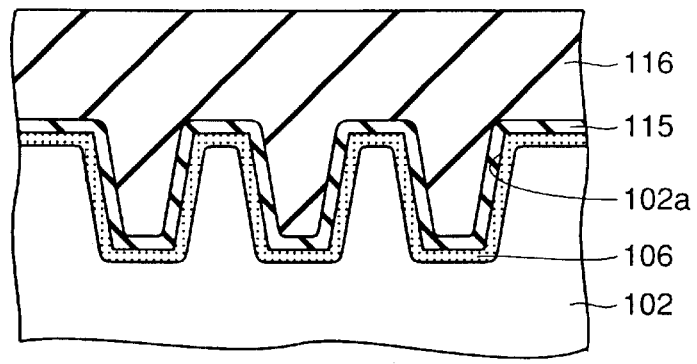
Figure 49:
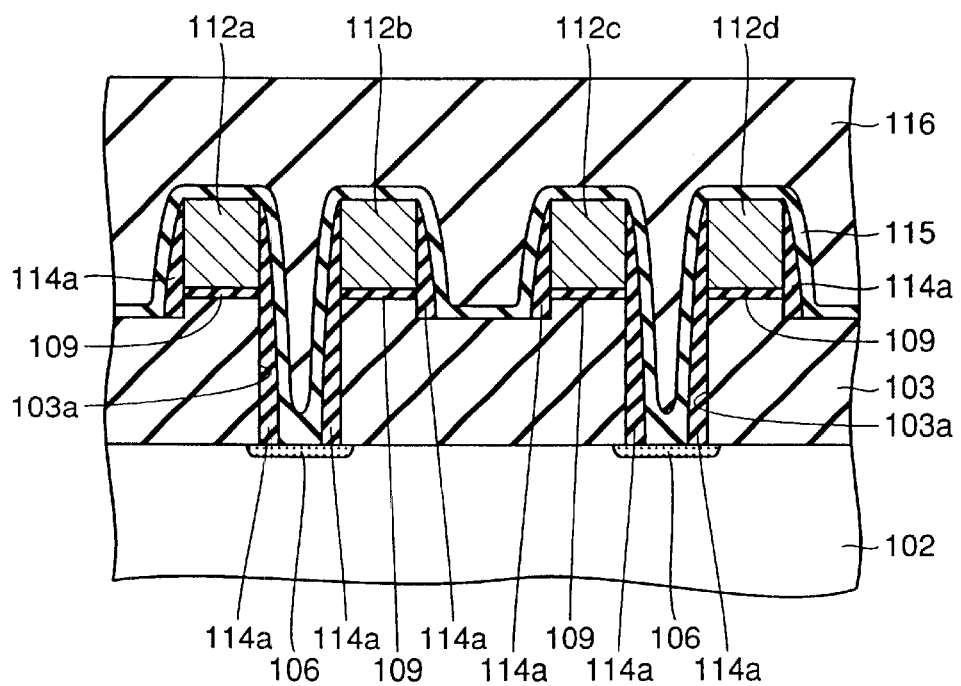
Figure 50:
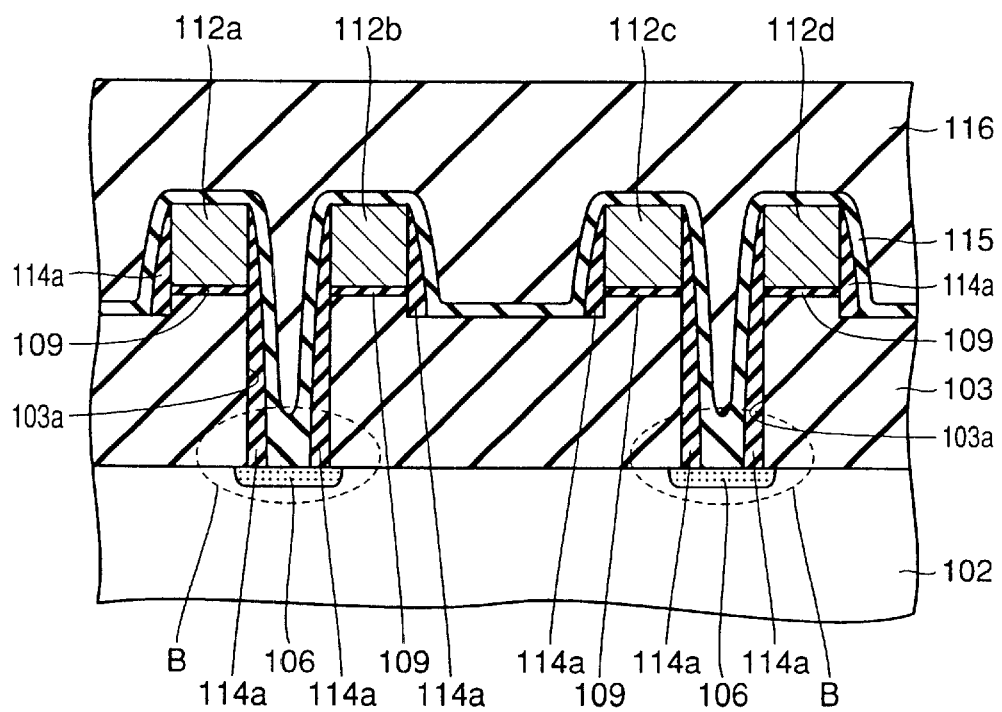
FIG. 50 is a cross section showing a problem in the conventional flash memory, and taken along line XLV—XLV in FIG. 43.
Figure 51:
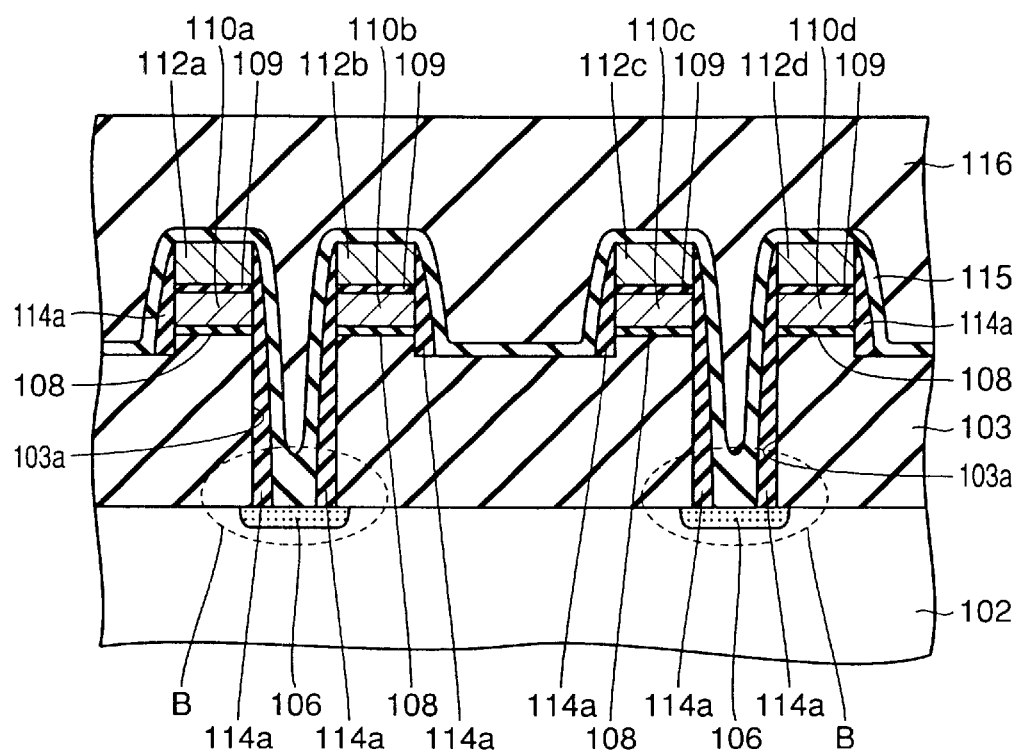
FIG. 51 is a cross section showing a problem in the conventional flash memory, and taken along line LI—LI in FIG. 43.

This will now be described. First, as shown in FIG. 41, a capacitance Cs between electrodes 10a and 12a and electrodes 10b and 12b is equal to the series connection of three capacitances, i.e., capacitances C1 and C2 based on BPTEOS film 16 and a capacitance C3 based on void 21. Capacitances C1, C2 and C3 satisfy the relationships of $C1=\epsilon_{OX} \cdot a/s$, $C2=\epsilon_{GAP} \cdot b/s$ and $C3=\epsilon_{OX} \cdot c/s$, where $\epsilon_{GAP}$ is a dielectric constant of void, $\epsilon_{OX}$ is a dielectric constant of the BPTEOS film, a and c are thicknesses of the BPTEOS film, respectively, b is a length of the void, and s is a sectional area.

According to the flash memory in the prior art or the first embodiment, a capacitance Co between electrodes 10a and 12a and electrodes 10b and 12b satisfies a relationship of $Co=\epsilon_{OX} \cdot f/s$, where a relationship of f=a+b+c is present. Since dielectric constant $\epsilon_{OX}$ of the BPTEOS film is sufficiently larger than dielectric constant $\epsilon_{GAP}$, capacitance Cs is smaller than capacitance Co. As a result, the capacitance between electrodes 10a and 12a and electrodes 10b and 12b on the opposite sides of the source region is reduced particularly between portions forming void 21 therebetween.

When the flash memory performs the read or write operation, the control gate electrode is charged with a corresponding operation voltage. The time for this charging is proportional to a product RC of a capacitance C, which is a sum of the gate capacitance and the parasitic capacitance, and an interconnection resistance R of the gate. As the charging time reduces, the operation speed can be increased.

In the flash memory of this embodiment, therefore, the provision of void 21 can reduce parasitic capacitance Cs between the control gate electrodes, which are located on the opposite sides of the source region, and therefore can reduce capacitance C without increasing interconnection resistance R of the gate. Thereby, it is possible to reduce the charging time lengths for the read and write operations, and high performance such as fast random read and fast write can be achieved.

In the flash memories of the foregoing embodiments, the BPTEOS film has been described as an example of the interlayer insulating film filling the opening. However, an insulating film made of a material other than the BPTEOS may be employed provided that the void can be formed within opening 3a, and other openings and stepped portions can be fully filled without forming a void.

The respective embodiments have been described in connection with flash memories each having the self-align source structure. In addition to the flash memory, the invention can be applied to nonvolatile semiconductor memory devices such as an EEPROM having a self-align source structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate having a main surface;

a groove formed at the main surface of said semiconductor substrate;

a first insulating film filling said groove;

two conductive layers formed over said first insulating film with a space between each other;

an opening formed in said first insulating film, and exposing the surface of said semiconductor substrate located immediately under the region located between said two conductive layers;

a second insulating film filling said opening, and covering said two conductive layers; and a void formed in said opening filled with said second insulating film.

2. The semiconductor device according to claim 1, wherein said void extends from a position between said first insulating films to a position between said two conductive layers.

3. The semiconductor device according to claim 1, further comprising:

an element formation region formed in said semiconductor substrate, crossing said two conductive layers, and isolated by said first insulating film; and an impurity region on one side of a predetermined conductivity type formed in said element formation region on the side remote from one of said two conductive layers and near the other conductive layer, and another impurity region on a different side of a predetermined conductivity type formed in said element formation region on the side remote from the other conductive layer, wherein said conductive layer includes a first electrode portion formed on said element formation region, and a second electrode portion formed on said first electrode. portion.

4. The semiconductor device according to claim 3, further comprising:

a conductive region formed at the surface of said semiconductor substrate located in the region between said two conductive layers, wherein said conductive region includes said impurity region on said one side.

5. The semiconductor device according to claim 3, wherein said first electrode portion includes a floating gate, said second electrode portion includes a control gate, said impurity region on said one side includes a source region, and said impurity region on the other side includes a drain region.

6. A semiconductor device comprising:

a semiconductor substrate;

a groove formed at said semiconductor substrate;

an element isolating and insulating film filling said groove;

an element formation region formed at said semiconductor substrate and isolated by said element isolating and insulating film;

a first gate interconnection formed across said element isolating and insulating film and said element formation region, and including a floating gate electrode and a control gate electrode;

a second gate interconnection formed across said element isolating and insulating film and said element formation region, spaced from said first gate interconnection, and including the floating gate electrode and the control gate electrode;

a source region formed in said element formation region located between said first gate interconnection and said second gate interconnection;

a drain region formed in said element formation region spaced from said source region with said first gate interconnection therebetween;

a conductive region including said source region, and formed in a region of said semiconductor substrate located between said first gate interconnection and said second gate interconnection;

an opening formed in said element isolating and insulating film, and exposing the surface of said semiconductor substrate located immediately under a region between said first gate interconnection and said second gate interconnection;

an interlayer insulating film filling said opening, covering said first gate interconnection and said second gate interconnection, and formed on said semiconductor substrate; and a void formed in said opening filled with said element isolating and insulating film.

7. The semiconductor device according to claim 6, wherein said void extends from a position between said element isolating and insulating films to a position between said first gate interconnection and said second gate interconnection.

8. A semiconductor device comprising:

a semiconductor substrate;

a first insulating film formed on said semiconductor substrate;

two interconnections formed on said first insulating film with a space between each other;

an opening formed at said first insulating film located between said two interconnections, exposing the surface of said semiconductor substrate and forming a plurality of neighboring first insulating film sections;

a second insulating film filling said opening, covering said interconnections, and formed on said semiconductor substrate; and a void formed in said opening filled with said second insulating film at least in a position between neighboring first insulating film sections.

9. The semiconductor device according to claim 8, wherein said void extends from a position between said first insulating films to a position between said two interconnections.

* * * * *